(12) United States Patent
Lee et al.

(10) Patent No.: US 10,018,919 B2
(45) Date of Patent: Jul. 10, 2018

(54) SYSTEM AND METHOD FOR FABRICATING METROLOGY TARGETS ORIENTED WITH AN ANGLE ROTATED WITH RESPECT TO DEVICE FEATURES

(71) Applicant: KLA-Tencor Corporation, Milpitas, CA (US)

(72) Inventors: Myungjun Lee, San Jose, CA (US); Mark D. Smith, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/224,290

(22) Filed: Jul. 29, 2016

(65) Prior Publication Data

US 2017/0343903 A1 Nov. 30, 2017

Related U.S. Application Data

(60) Provisional application No. 62/342,986, filed on May 29, 2016.

(51) Int. Cl.
 *G03B 27/54* (2006.01)
 *G03F 7/20* (2006.01)
 *G03F 1/22* (2012.01)

(52) U.S. Cl.
 CPC ............ *G03F 7/70283* (2013.01); *G03F 1/22* (2013.01); *G03F 7/70091* (2013.01)

(58) Field of Classification Search
 CPC ............. G03F 7/70641; G03F 7/70733; G03F 7/70091; G03F 7/70283
 (Continued)

(56) References Cited

U.S. PATENT DOCUMENTS 5,608,526 A 3/1997 Piwonka-Corle et al.
5,859,424 A 1/1999 Norton et al.
(Continued)

OTHER PUBLICATIONS

Philippe Leray et al., Overlay metrology solutions in a triple patterning scheme, Metrology, Inspection, and Process Control for Microlithography XXIX, Proc. of SPIE vol. 9424, 94240E, © 2015 SPIE, Mar. 24, 2015, pp. 94240E-1-94240E-8.
(Continued)

*Primary Examiner* — Hung Henry Nguyen
(74) *Attorney, Agent, or Firm* — Suiter Swantz pc llo

(57) ABSTRACT

A lithography system includes an illumination source including two illumination poles separated along a first direction and symmetrically distributed around an optical axis, a pattern mask to receive illumination from the illumination source, and a set of projection optics to generate an image corresponding to the pattern mask onto a sample. The pattern mask includes a metrology target pattern mask and device pattern mask elements. The device pattern mask elements are distributed along the first direction with a device separation distance. The metrology target pattern mask includes a set of metrology target pattern mask elements having a diffraction pattern corresponding to that of the device pattern mask elements. A metrology target generated on the sample associated with the metrology target pattern mask is characterizable along a second direction and has printing characteristics corresponding to those of device pattern elements generated on the sample associated with the device pattern mask elements.

23 Claims, 18 Drawing Sheets

(58) Field of Classification Search
USPC .................. 355/52, 53, 55, 67; 356/399–401
See application file for complete search history.

(56) References Cited

U.S. PATENT DOCUMENTS

| | | | |
|---|---|---|---|
| 6,429,943 B1 | 8/2002 | Opsal et al. | |
| 6,985,618 B2 | 1/2006 | Adel et al. | |
| 7,408,642 B1* | 8/2008 | DiBiase | G03F 7/70633 |
| | | | 356/399 |
| 7,478,019 B2 | 1/2009 | Zangooie et al. | |
| 7,545,520 B2 | 6/2009 | Lee et al. | |
| 7,667,842 B2* | 2/2010 | Schulz | G03F 7/70633 |
| | | | 356/401 |
| 7,925,486 B2 | 4/2011 | Smith et al. | |
| 7,933,026 B2 | 4/2011 | Opsal et al. | |
| 8,214,771 B2 | 7/2012 | Adel et al. | |
| 8,930,156 B2 | 1/2015 | Adel et al. | |
| 9,291,554 B2 | 3/2016 | Kuznetsov et al. | |
| 2006/0172207 A1 | 8/2006 | Asaba et al. | |
| 2008/0291412 A1 | 11/2008 | Kazinczi et al. | |
| 2009/0135390 A1* | 5/2009 | La Fontaine | G03F 7/70125 |
| | | | 355/67 |
| 2011/0249244 A1 | 10/2011 | Leewis et al. | |
| 2011/0273685 A1* | 11/2011 | Li | G03B 21/26 |
| | | | 355/53 |
| 2012/0303151 A1 | 11/2012 | Ye et al. | |
| 2013/0042089 A1 | 2/2013 | Vinh et al. | |
| 2014/0172394 A1 | 6/2014 | Kuznetsov et al. | |
| 2014/0222380 A1 | 8/2014 | Kuznetsov et al. | |
| 2014/0257734 A1 | 9/2014 | Bringoltz et al. | |
| 2015/0204664 A1 | 7/2015 | Bringoltz et al. | |
| 2015/0309402 A1 | 10/2015 | Levinski et al. | |
| 2016/0334716 A1* | 11/2016 | Mieher | G03F 7/70641 |

OTHER PUBLICATIONS

Myungjun Lee et al., Metrology target design (MTD) solution for diagonally orientated DRAM layer, Metrology, Inspection, and Process Control for Microlithography XXX, Proc. of SPIE vol. 9778, Mar. 8, 2016, pp. 97782R-1-97782R-14.

Myungjun Lee et al., Lithography-aware overlay metrology target design method, Metrology, Inspection, and Process Control for Microlithography XXX, Proc. of SPIE vol. 9778, Mar. 24, 2016, pp. 97781L-1-97781L-14.

* cited by examiner

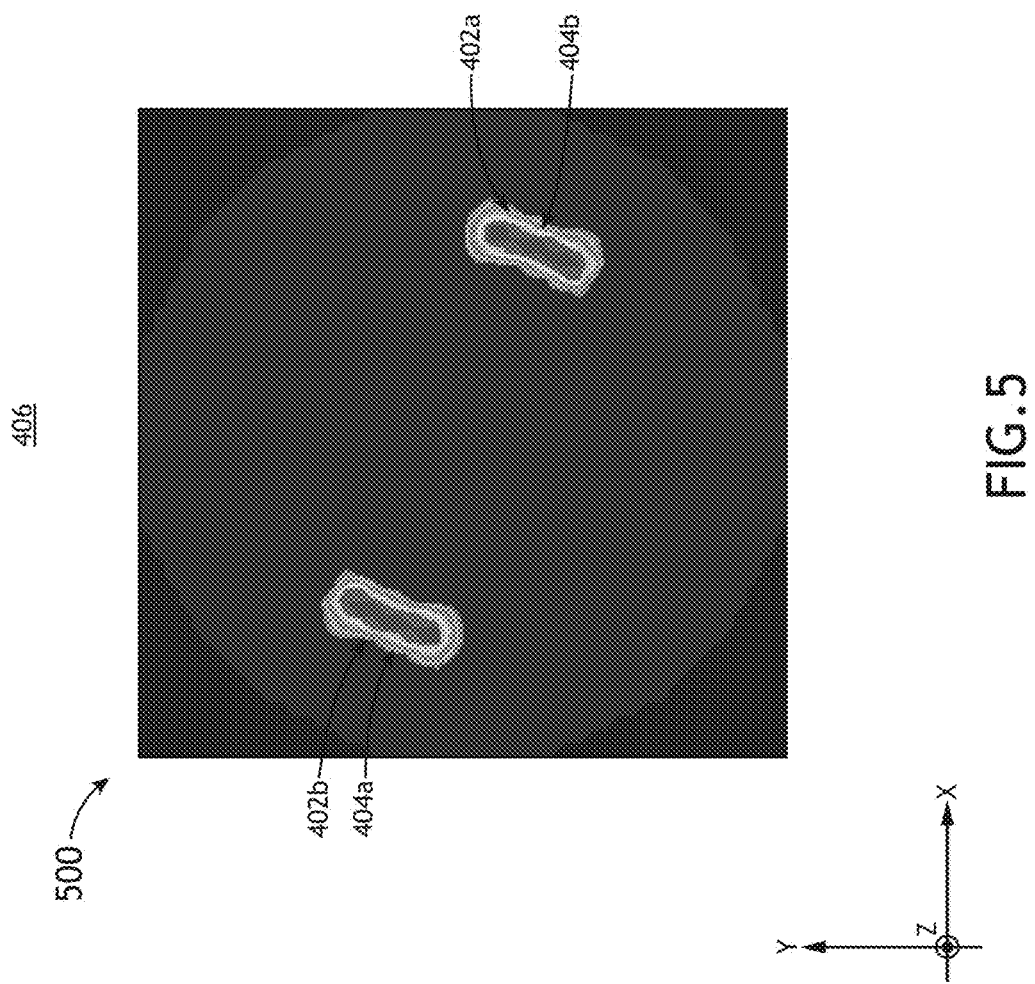

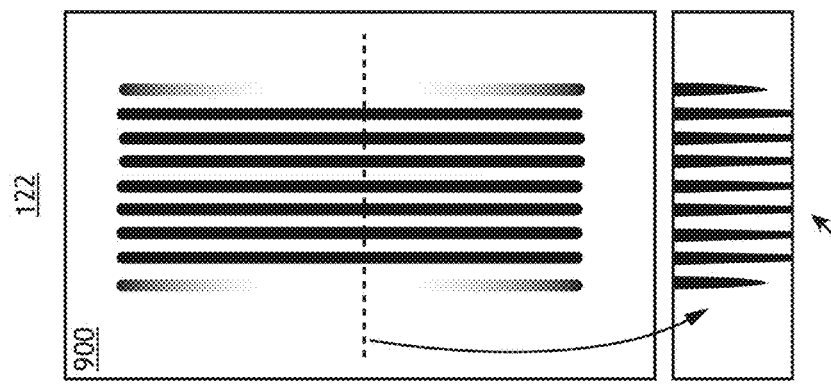
FIG. 9A
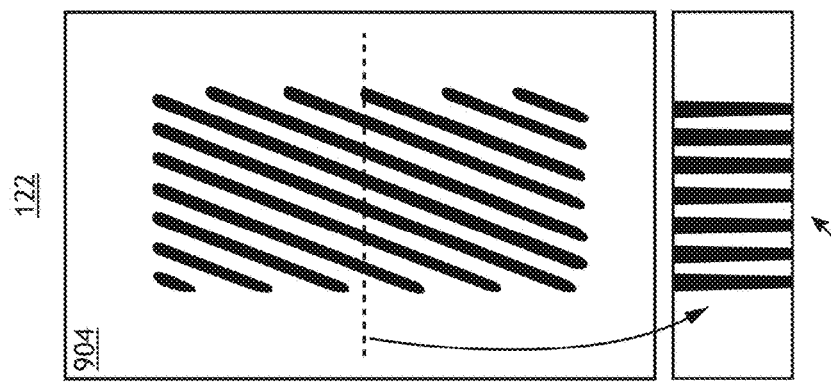
FIG. 9B
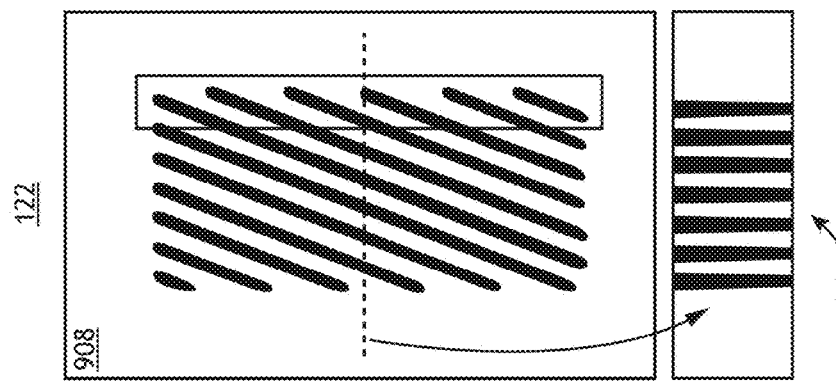
FIG. 9C
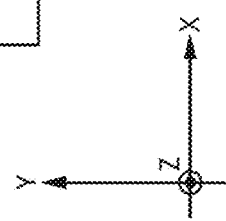

SYSTEM AND METHOD FOR FABRICATING METROLOGY TARGETS ORIENTED WITH AN ANGLE ROTATED WITH RESPECT TO DEVICE FEATURES

CROSS-REFERENCE TO RELATED APPLICATION

The present application claims the benefit under 35 U.S.C. § 119(e) of U.S. Provisional Application Ser. No. 61/973,266, filed Apr. 1, 2014, entitled OVERLAY METROLOGY TARGET DESIGN USING DIAGONAL SUB-RESOLUTION ASSIST FEATURES FOR TILTED DEVICES ILLUMINATED BY ROTATED ILLUMINATION, naming Myungjun Lee and Mark D. Smith as inventors, which is incorporated herein by reference in the entirety.

TECHNICAL FIELD

The present invention relates generally to metrology, and more particularly, to metrology targets oriented with an angle rotated with respect to device features.

BACKGROUND

Metrology targets are typically designed to provide diagnostic information measurable along two orthogonal measurement directions. In this regard, a metrology tool may measure one or more metrology metrics (e.g. overlay error, critical dimensions, sidewall angles, and the like) of the metrology target along the two orthogonal measurement directions as a basis for characterizing the printing characteristics of a semiconductor layer in all directions. However, it may be the case that some printed device features in the semiconductor layer are rotated with respect to the orthogonal measurement directions governed by the metrology target. Further, as noted above, an illumination profile tailored to fabricate device features with a specific orientation (e.g. a rotated dipole illumination profile tailored to fabricate rotated line/space features of the illustrative example above) may not provide the same printing characteristics in all directions. In this way, a metrology target containing printed features oriented along the orthogonal measurement directions may exhibit different printing characteristics than the device features. Accordingly, metrology measurements of the metrology target may not provide an accurate representation of printing characteristics of the device features. Therefore, it would be desirable to provide a system and method for curing defects such as those identified above.

SUMMARY

A lithography system is disclosed in accordance with one or more illustrative embodiments of the present disclosure. In one illustrative embodiment, the lithography system includes an illumination source including two illumination poles symmetrically distributed around an optical axis of the lithography system. In another illustrative embodiment, the two illumination poles are separated along a first direction. In another illustrative embodiment, the lithography system includes a pattern mask positioned to receive illumination from the illumination source. In another illustrative embodiment, the pattern mask includes a metrology target pattern mask and a plurality of device pattern mask elements. In another illustrative embodiment, at least a portion of the device pattern mask elements are distributed along the first direction with a device separation distance. In another illustrative embodiment, the metrology target pattern mask includes a set of metrology target pattern mask elements having a diffraction pattern corresponding to a diffraction pattern of the plurality of device pattern mask elements. In another illustrative embodiment, the lithography system includes a set of projection optics to generate an image corresponding to the pattern mask onto a sample. In another illustrative embodiment, a metrology target generated on the sample associated with the metrology target pattern mask is characterizable along a second direction different than the first direction. In another illustrative embodiment, one or more printing characteristics of the metrology target correspond to one or more printing characteristics of device pattern elements generated on the sample associated with the device pattern mask elements.

A lithography system is disclosed in accordance with one or more illustrative embodiments of the present disclosure. In one illustrative embodiment, the lithography system includes an illumination source including two illumination poles symmetrically distributed around an optical axis of the lithography system. In another illustrative embodiment, the two illumination poles are separated along a first direction. In another illustrative embodiment, a pattern mask positioned to receive illumination from the illumination source. In another illustrative embodiment, the pattern mask includes a metrology target pattern mask and a plurality of device pattern mask elements. In another illustrative embodiment, at least a portion of the device pattern mask elements are distributed along the first direction with a device separation distance. In another illustrative embodiment, the metrology target pattern mask includes a set of metrology target pattern mask elements distributed along the first direction with the device separation distance. In another illustrative embodiment, the lithography system includes a set of projection optics to generate an image corresponding to the pattern mask onto a sample. In another illustrative embodiment, a metrology target generated on the sample associated with the metrology target pattern mask is characterizable along a second direction different than the first direction.

A pattern mask is disclosed in accordance with one or more illustrative embodiments of the present disclosure. In one illustrative embodiment, the pattern mask includes a metrology target pattern mask. In another illustrative embodiment, the pattern mask includes a plurality of device pattern mask elements. In another illustrative embodiment, at least a portion of the device pattern mask elements are distributed along a first direction with a device separation distance. In another illustrative embodiment, the metrology target pattern mask includes a set of metrology target pattern mask elements having a diffraction pattern corresponding to a diffraction pattern of the plurality of device pattern mask elements. In another illustrative embodiment, a metrology target generated on a sample associated with an image of the metrology pattern mask includes one or more printing characteristics corresponding to one or more printing characteristics of device pattern elements generated on the sample associated with the device pattern mask elements. In another illustrative embodiment, the metrology target generated on the sample is characterizable along a second direction different than the first direction.

A method for designing a metrology target pattern mask is disclosed in accordance with one or more illustrative embodiments of the present disclosure. In one illustrative embodiment, the method includes generating a model of a plurality of metrology target pattern masks with different segmentation pitches. In another illustrative embodiment, metrology target pattern masks of the plurality of metrology target pattern masks include a set of metrology target pattern mask elements distributed along a first direction. In another illustrative embodiment, the method includes simulating one or more printing characteristics of a plurality of metrology targets associated with images of the plurality of metrology target pattern masks. In another illustrative embodiment, the metrology targets are characterizable along a second direction different than the first direction. In another illustrative embodiment, the method includes comparing the one or more printing characteristics of the plurality metrology targets with one or more printing characteristics of a plurality of device pattern elements associated with an image of the plurality of device pattern mask elements. In another illustrative embodiment, the method includes selecting a particular metrology target pattern mask of the plurality of metrology target pattern masks based on a correspondence between the comparison of the one or more printing characteristics of the plurality metrology targets with the one or more printing characteristics of the plurality of device pattern elements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 5 is a plot illustrating the distribution of diffracted beams in the pupil plane 406 of a lithography sub-system, in accordance with one or more embodiments of the present disclosure.

FIG. 9A is a diagram view of a printed pattern feature associated with pattern mask features illustrated in FIG. 7A, in accordance with one or more embodiments of the present disclosure.

FIG. 9B is a diagram view of a printed pattern feature 904 associated with pattern mask features illustrated in FIG. 7B, in accordance with one or more embodiments of the present disclosure.

FIG. 9C is a diagram view of a printed pattern feature 908 associated with pattern mask features illustrated in FIG. 7C, in accordance with one or more embodiments of the present disclosure.

DETAILED DESCRIPTION

Figure 1A:
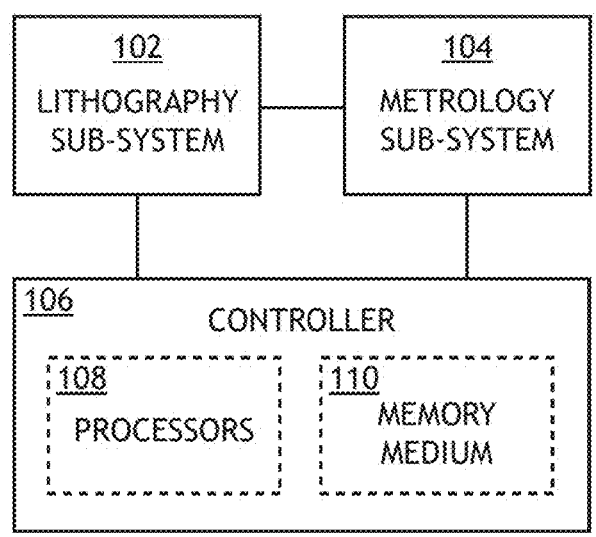
FIG. 1A is a conceptual view illustrating a semiconductor device system, in accordance with one or more embodiments of the present disclosure.

Reference will now be made in detail to the subject matter disclosed, which is illustrated in the accompanying drawings.

Referring generally to FIGS. 1 through 10, embodiments of the present disclosure are directed to a metrology target with rotated segmented pattern elements. Additional embodiments are directed to a metrology target with rotated segmented pattern elements in which the orientation and/or separation of the segments corresponds to an orientation and/or separation of printed elements of a device. Additional embodiments are directed a metrology target with rotated segmented pattern elements including sub-resolution assist features (SRAFs) with rotated segmented pattern elements in which the orientation and/or separation of the segments corresponds to an orientation and/or separation of printed elements of a device. In this regard, deviations of a lithography process may similarly impact the printing characteristics of the printed elements of the device and the metrology target. Further embodiments are directed to a pattern mask for providing a metrology target with rotated segmented pattern elements.

It is recognized herein that a semiconductor device may by formed as multiple printed layers of patterned material on a substrate. Each printed layer may be fabricated through a series of process steps such as, but not limited to, one or more material deposition steps, one or more lithography steps, or one or more etching steps. Further, each printed layer must be fabricated within specific tolerances to properly construct the final device. For example, printing characteristics such as, but not limited to, the linewidths, sidewall angles, and relative placement of printed elements in each layer must be well characterized and controlled. Accordingly, metrology targets may be fabricated on one or more printed layers to enable efficient characterization of the printing characteristics of the layers. In this regard, deviations of printed characteristics of metrology targets on a printed layer may be representative of deviations of printed characteristics of all printed elements on the layer.

The minimum feature size as well as the density of features of a printed pattern in a lithography step is limited at least in part by the optical resolution of projection optics of the lithography system. However, features near or below the resolution of a lithography system may be fabricated using various lithography techniques.

Metrology targets may typically include well-defined printed elements arranged with a specific geometry to provide an accurate representation of one or more printing characteristics. Accordingly, metrology targets may typically be designed to provide accurate measurements of printing characteristics along two orthogonal directions. For example, overlay metrology targets may include printed elements on two or more printed layers arranged such that the relative positions of elements of each layer may be measured along two orthogonal directions to describe offset errors (e.g. pattern placement errors (PPE)) along any direction.

It is generally desirable that printed elements of a metrology target on a given layer print with the same characteristics (e.g. pattern placement error, sidewall angle, critical dimensions, or the like) as printed device elements of that layer. In this regard, printing characteristics of a metrology target may be used to characterize the printing characteristics of the entire printed layer. However, the use of metrology targets with well-defined measurement directions may present challenges for device layers containing printed elements rotated with respect to the measurement directions.

Further, the degree to which characteristics of a printed feature are robust to deviations of process parameters may depend on a variety of factors. For example, robustness to deviations of process parameters may be influenced by characteristics of the desired pattern features such as, but not limited to, the dimensions and/or the density of the desired printed features. Additionally, robustness to deviations of process parameters may be influenced by optical characteristics of the lithography tool such as, but not limited to, the depth of focus (DOF), the numerical aperture (NA) of projection optics, the shape of the illumination source, the symmetry of the illumination source, the spectral content of the illumination source, or coherence of the illumination source. Further, robustness to deviations of process parameters may be influenced by characteristics of the pattern mask imaged onto the sample to generate the printed patterns such as, but not limited to, the transmission of pattern elements, the optical phase induced by the pattern elements, or the dimensions of pattern elements with respect to the resolution of the projection optics. Further, many such characteristics associated with the robustness of printed parameters may be interdependent.

It may therefore be the case that a particular configuration of the lithography system (e.g. an illumination profile of an illumination source, a pattern mask technology, or the like) tailored for printed elements of a particular layer may not provide consistent printing characteristics for the device elements and the metrology target elements. In some cases, a profile of the illumination source may be tailored for a particular pattern and/or orientation. As an illustrative example, off-axis illumination may improve the resolution and/or the depth of field relative to on-axis illumination by directing higher-order diffraction orders from the pattern mask to the projection optics. Accordingly, an illumination source tailored for printing a periodic series of lines (e.g. a line/space pattern) may include a dipole illumination source consisting of two illumination poles separated along the pitch direction of the printed lines (e.g. orthogonal to the printed lines). A pattern mask for this layer may include mask patterns for a metrology target with well-defined measurement directions as well as the line/space patterns rotated with respect to the measurement directions. However, printing characteristics (e.g. pattern placement error, or the like) of the device elements and the metrology elements may not be consistent. Further, temporally changing aberrations within a lithography system (e.g. associated with fluctuations of temperature, pressure, air flow, or the like in a lithography system) may result in unpredictable variations of printing characteristics of the device elements and the metrology target elements.

Embodiments of the present disclosure are directed to systems and methods for providing and/or analyzing metrology targets having printing characteristics that correspond to printing characteristics of rotated device elements in the same printed layer. Additional embodiments are directed to systems and methods for providing and/or analyzing metrology targets having a diffraction pattern corresponding to a diffraction pattern of the rotated device elements.

As used throughout the present disclosure, the term "sample" generally refers to a substrate formed of a semiconductor or non-semiconductor material (e.g. a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

FIG. 1A is a conceptual view illustrating a semiconductor device system 100, in accordance with one or more embodiments of the present disclosure. In one embodiment, the system 100 includes a lithography sub-system 102 for lithographically printing one or more patterns (e.g. metrology target patterns, or the like) to a sample 122, in accordance with one or more embodiments of the present disclosure. The lithography sub-system 102 may include any lithographic printing tool known in the art. For example, the lithography sub-system 102 may include, but is not limited to, a scanner or stepper. In another embodiment, the system 100 includes a metrology sub-system 104 to characterize one or more printed patterns on the sample 122. For example, the metrology sub-system 104 may measure any metrology metric (e.g. overlay error, CD, sidewall angle, or the like) using any method known in the art. In one embodiment, the metrology sub-system 104 includes an image-based metrology tool to measure metrology data based on the generation of one or more images of the sample 122. In another embodiment, the metrology sub-system 104 includes a scatterometry-based metrology system to measure metrology data based on the scattering (reflection, diffraction, diffuse scattering, or the like) of light from the sample.

In another embodiment, the system 100 includes a controller 106. In another embodiment, the controller 106 includes one or more processors 108 configured to execute program instructions maintained on a memory medium 110. In this regard, the one or more processors 108 of controller 106 may execute any of the various process steps described throughout the present disclosure. Further, the controller 106 may be communicatively coupled to the mask support device 116 and/or the sample stage 124 to direct the transfer of pattern elements on a pattern mask 118 to a sample 122 (e.g. a resist layer 126 on the sample, or the like). It is noted herein that the lithography sub-system 102 of the present invention may implement any of the pattern mask designs described throughout the present disclosure. Lee et al. generally describe mask-based lithography in U.S. Pat. No. 7,545,520, issued on Jun. 9, 2009, which is incorporated herein in the entirety.

The metrology sub-system 104 may provide various types of measurements related to semiconductor manufacturing. For example, the metrology sub-system 104 may provide one or more metrology metrics of one or more metrology targets such as, but not limited to, critical dimensions, overlay, sidewall angles, film thicknesses, or process-related parameters (e.g., focal position of the sample 122 during a lithography step, an exposure dose of illumination during a lithography step, or the like).

Figure 1B:
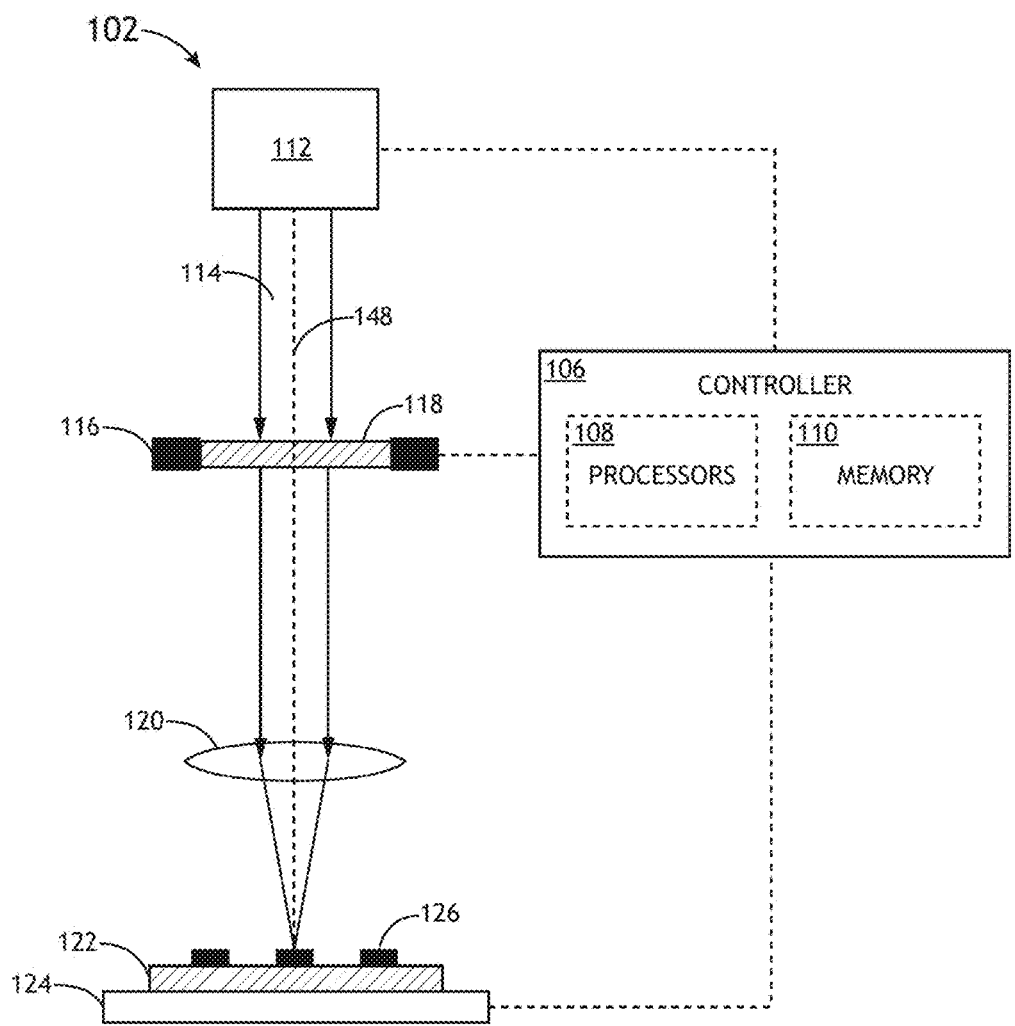
FIG. 1B is a conceptual view illustrating a lithography sub-system, in accordance with one or more embodiments of the present disclosure.

FIG. 1B is a conceptual view illustrating the lithography sub-system 102, in accordance with one or more embodiments of the present disclosure. In one embodiment, the lithography sub-system 102 includes an illumination source 112 configured to generate one or more illumination beams 114. The one or more illumination beams 114 may include one or more selected wavelengths of light including, but not limited to, ultraviolet (UV) radiation, visible radiation, or infrared (IR) radiation. In another embodiment, the illumination source 112 may generate one or more illumination beams 114 having any pattern known in the art. For example, the illumination source 112 may include, but is not limited to, a single-pole illumination source, a dipole illumination source, a C-Quad illumination source, a Quasar illumination source, or a free-form illumination source.

In another embodiment, the lithography sub-system 102 includes a mask support device 116. The mask support device 116 is configured to secure a pattern mask 118. In another embodiment, the lithography sub-system 102 includes a set of projection optics 120 configured to project an image of the pattern mask 118 illuminated by the one or more illumination beams 114 onto the surface of a sample 122 disposed on a sample stage 124. For example, the set of projection optics 120 may be configured to project an image of the pattern mask 118 onto a resist layer 126 on the sample 122 to generate (e.g. expose, or the like) a printed pattern element (e.g. a metrology pattern) on the resist layer 126 corresponding to a pattern element on the pattern mask 118. In another embodiment, the mask support device 116 may be configured to actuate or position the pattern mask 118. For example, the mask support device 116 may actuate the pattern mask 118 to a selected position with respect to the projection optics 120 of the system 100.

The pattern mask 118 may be utilized (e.g. by lithography sub-system 102) in any imaging configuration known in the art. For example, the pattern mask 118 may be a positive mask (e.g. a bright-field mask) in which pattern elements are positively imaged as printed pattern elements of a resist layer 126 of sample 122. By way of another example, the pattern mask 118 may be a negative mask (e.g. a dark-field mask) in which pattern elements of the pattern mask 118 form negative printed pattern elements (e.g. gaps, spaces, or the like) of a resist layer 126 of sample 122.

Figure 1C:
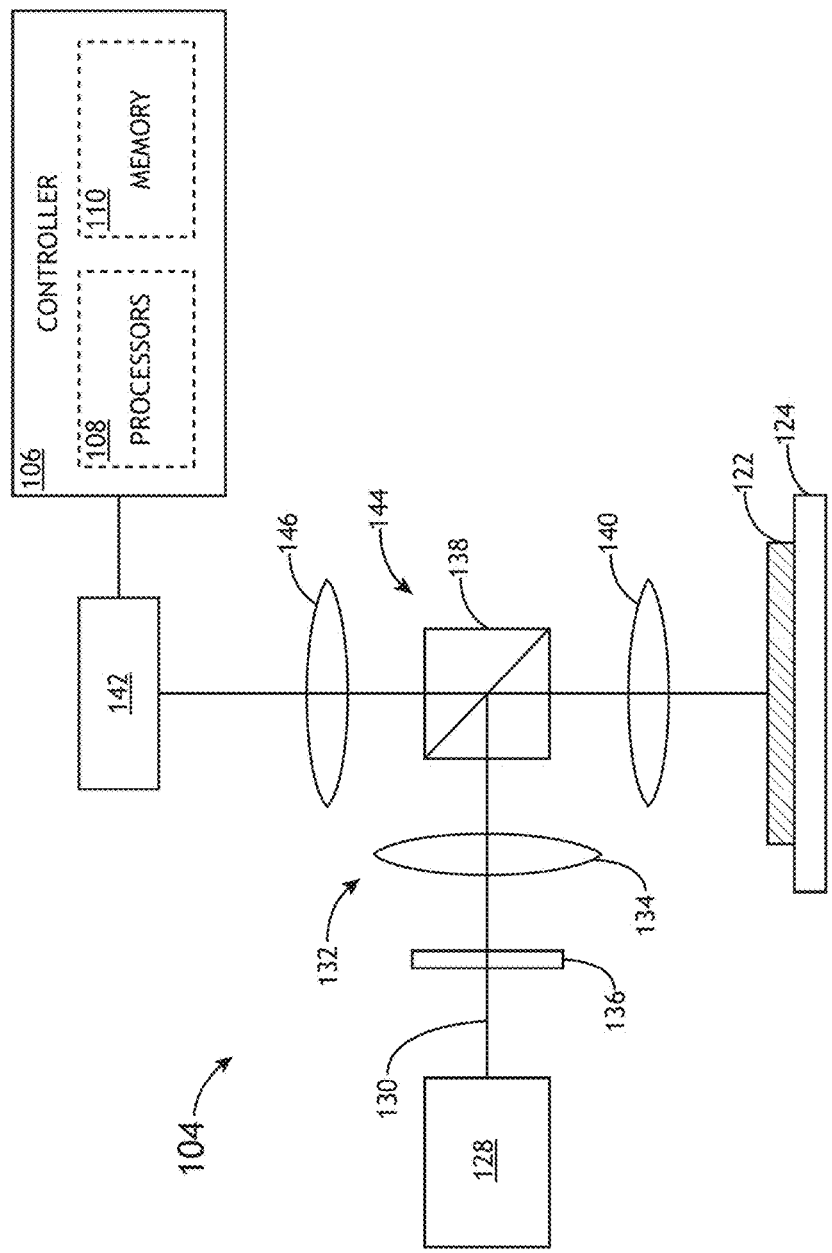
FIG. 1C is a conceptual view illustrating a metrology sub-system, in accordance with one or more embodiments of the present disclosure.

FIG. 1C is a conceptual view illustrating the metrology sub-system 104, in accordance with one or more embodiments of the present disclosure. In one embodiment, the metrology sub-system 104 includes a metrology illumination source 128 to generate a metrology illumination beam 130. In another embodiment, the metrology illumination source 128 is the same as the illumination source 112. In a further embodiment, the metrology illumination source 128 is a separate illumination source configured to generate a separate metrology illumination beam 130. The metrology illumination beam 130 may include one or more selected wavelengths of light including, but not limited to, ultraviolet (UV) radiation, visible radiation, or infrared (IR) radiation.

In another embodiment, the metrology illumination source 128 directs the metrology illumination beam 130 to the sample 122 via an illumination pathway 132. The illumination pathway 132 may include one or more lenses 134. Further, the illumination pathway 132 may include one or more additional optical components 136 suitable for modifying and/or conditioning the metrology illumination beam 130. For example, the one or more optical components 136 may include, but are not limited to, one or more polarizers, one or more filters, one or more beam splitters, one or more diffusers, one or more homogenizers, one or more apodizers, or one or more beam shapers. In one embodiment, the illumination pathway 132 includes a beamsplitter 138. In another embodiment, the metrology sub-system 104 includes an objective lens 140 to focus the metrology illumination beam 130 onto the sample 122.

In another embodiment, the metrology sub-system 104 includes one or more detectors 142 configured to capture radiation emanating from the sample 122 through a collection pathway 144. The collection pathway 144 may include multiple optical elements to direct and/or modify illumination collected by the objective lens 140 including, but not limited to one or more lenses 146, one or more filters, one or more polarizers, one or more beam blocks, or one or more beamsplitters.

For example, a detector 142 may receive an image of the sample 122 provided by elements in the collection pathway 144 (e.g. the objective lens 140, the one or more lenses 146, or the like). By way of another example, a detector 142 may receive radiation reflected or scattered (e.g. via specular reflection, diffuse reflection, and the like) from the sample 122. By way of another example, a detector 142 may receive radiation generated by the sample (e.g. luminescence associated with absorption of the metrology illumination beam 130, and the like). By way of another example, a detector 142 may receive one or more diffracted orders of radiation from the sample 122 (e.g. 0-order diffraction, ±1 order diffraction, ±2 order diffraction, and the like). Further, it is noted herein that the one or more detectors 142 may include any optical detector known in the art suitable for measuring illumination received from the sample 122. For example, a detector 142 may include, but is not limited to, a CCD detector, a TDI detector, a photomultiplier tube (PMT), an avalanche photodiode (APD), or the like. In another embodiment, a detector 142 may include a spectroscopic detector suitable for identifying wavelengths of radiation emanating from the sample 122. Further, the metrology sub-system 104 may include multiple detectors 142 (e.g. associated with multiple beam paths generated by one or more beamsplitters) to facilitate multiple metrology measurements (e.g. multiple metrology tools) by the metrology sub-system 104.

In another embodiment, the metrology sub-system 104 is communicatively coupled to the controller 106 of system 100. In this regard, the controller 106 may be configured to receive data including, but not limited to, metrology data (e.g. metrology measurement results, images of the target, pupil images, and the like) or metrology metrics (e.g. precision, tool-induced shift, sensitivity, diffraction efficiency, through-focus slope, side wall angle, critical dimensions, and the like).

Figure 2A:
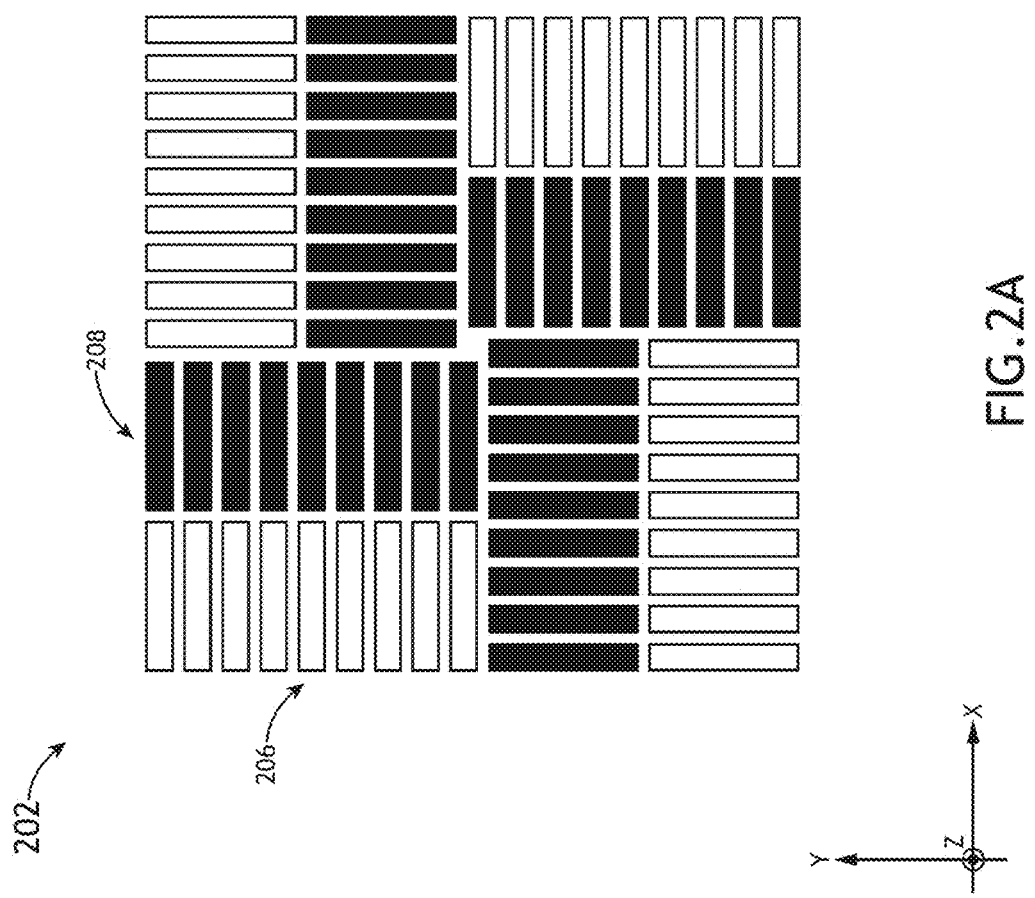
FIG. 2A is a top view illustrating a portion of a sample including a metrology target in accordance with one or more embodiments of the present disclosure.
Figure 2B:
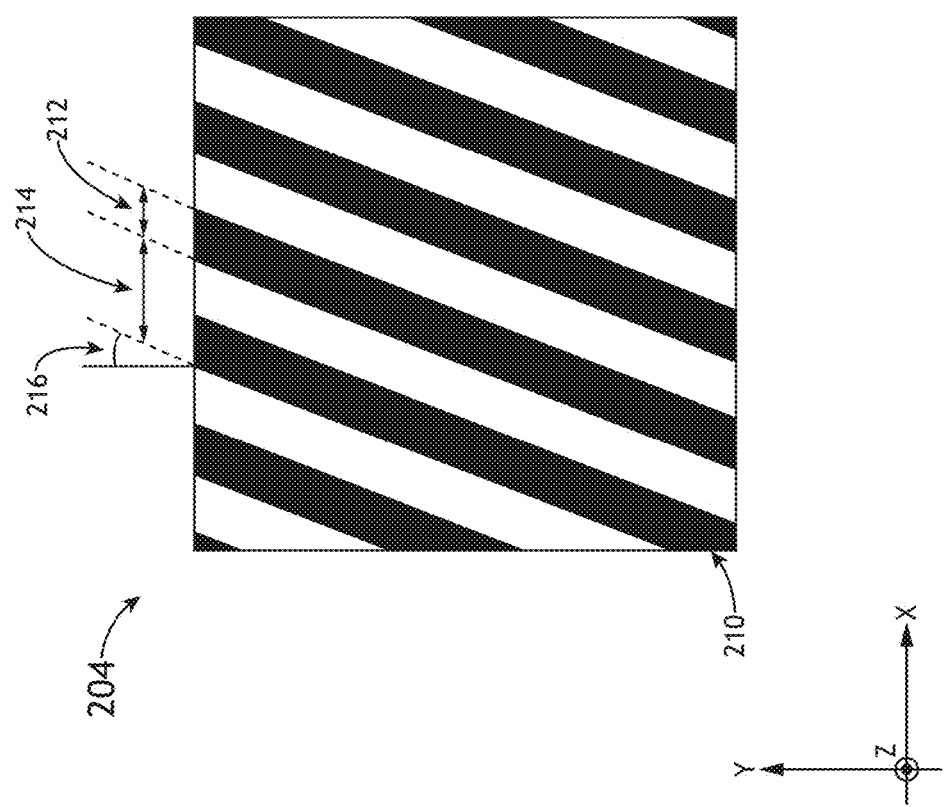
FIG. 2B is a top view illustrating a portion of the sample including printed device features rotated with respect to the metrology target, in accordance with one or more embodiments of the present disclosure.

FIGS. 2A and 2B are top views of a sample illustrating a metrology target 202, and printed device features 204 rotated with respect to the metrology target 202. It is recognized herein that any given printed layer of the sample 122 may include printed device features 204 associated with a fabricated device as well as one or more printed elements associated with the metrology target 202. In this regard, printed elements of the metrology target 202 in the printed layer may provide diagnostic information related to the lithography process of that layer. Further, a metrology target 202 may be representative of the printed device features 204 of the fabricated device such that deviations of the lithography process impacting the printing of the printed device features 204 may be measured by characterizing the metrology target 202. For example, deviations of the lithography process may include, but are not limited to, misalignment of a printed layer relative to one or more previously printed layers, modifications of the linewidths of printed device features, and the like). Accordingly, it may be desirable that the printing characteristics of the metrology target 202 correspond to the printing characteristics of the printed device features 204.

FIG. 2A is a top view illustrating a portion of a sample 122 including a metrology target 202 in accordance with one or more embodiments of the present disclosure. In one embodiment, the metrology target 202 includes printed features located on one or more printed layers of the sample 122. For example, as shown in FIG. 2A, a metrology target 202 configured as an overlay metrology target may include a first set of printed metrology features 206 on a first printed layer of the sample 122 and a second set of printed metrology features 208 on a second printed layer of the sample 122. Accordingly, an offset (e.g. pattern placement error (PPE)) of the second layer relative to the first printed layer may be characterized by measuring the relative positions of the first set of printed metrology features 206 and the second set of printed metrology features 208.

In another embodiment, the metrology target 202 is oriented such that metrology measurements are made along two orthogonal directions (e.g. the X-direction and the Y-direction of FIG. 2A). For example, the first set of printed metrology features 206 and the second set of printed metrology features 208 may include printed elements with edges defined along the X-direction and the Y-direction such that the relative location of the first set of printed metrology features 206 and the second set of printed metrology features 208 along the X-direction and the Y-direction may be readily measured (e.g. by metrology sub-system 104, or the like). In this regard, the measurement directions may serve as a basis to characterize the relative position of the first set of printed metrology features 206 and the second set of printed metrology features 208 along any direction within the plane of the sample 122. Accordingly, the relative position of the first set of printed metrology features 206 and the second set of printed metrology features 208 along an arbitrary direction within the plane of the sample 122 may be characterized by offsets associated with projected components along the measurement directions.

FIG. 2B is a top view illustrating a portion of the sample 122 including printed device features 204 rotated with respect to the metrology target 202, in accordance with one or more embodiments of the present disclosure. In one embodiment, a printed layer of the sample 122 includes both the printed device features 204 and a set of printed metrology features. In another embodiment, the printed device features 204 are associated with at least one printed layer of the sample 122 containing printed metrology features. For example, printed device features 204 may be printed on the same printed layer as the first set of pattern mask features 602. In this regard, one or more printability characteristics associated with the first set of pattern mask features 602 may be representative of printability characteristics of the printed device features 204. Accordingly, the metrology sub-system 104 may measure one or more printability characteristics (e.g. overlay, a critical dimension, sidewall angle, or the like) of the first set of pattern mask features 602.

In another embodiment, the printed device features 204 include one or more features rotated with respect to any measurement directions associated with the metrology target 202. For example, the printed device features 204 may have one or more edges oriented along a direction rotated with respect to any measurement directions associated with the metrology target 202. In another embodiment, as illustrated in FIG. 2, the printed device features 204 include a rotated line-space pattern formed as a set of printed line features 210 with a device width 212 separated by a device pitch 214. For example, the printed device features 204 may be rotated with a rotation angle 216 with respect to the Y-direction as illustrated in FIG. 2. In this regard, the direction of the device pitch 214 may not be aligned with any of the measurement directions of the metrology target 202.

It is noted herein that rotated line-space patterns may be, but are not required to be, associated with an active memory layer of a sample 122. It is further noted that the depiction of a metrology target 202 in FIG. 2 and the associated description are provided solely for illustrative purposes and should not be interpreted as limiting the present disclosure. For example, a sample 122 may include any type of metrology target known in the art configured for any type of metrology measurement. In one instance, the metrology target 202 may be configured as an overlay metrology target suitable for characterizing the relative alignment of more than two printed layers. In another instance, the sample 122 may, but is not required to, include one or more metrology targets suitable for the characterization of one or more critical dimensions or one or more sidewall angles. In another instance, the sample 122 may include one or more process-sensitive metrology targets suitable for monitoring the lithography sub-system 102 such as, but not limited to, a focus-sensitive metrology target for the determination of the location of the sample 122 within the focal volume of the lithography sub-system 102 during a lithography step, or an exposure-sensitive metrology target for the determination of the dose of illumination received by the sample 122 during a lithography step.

Each printed layer of a semiconductor device fabricated on a sample 122 may be formed from a series of process steps including one or more lithography steps. Further, a configuration of the lithography sub-system 102 may be tailored for each printed layer, or more particularly, for particular structures to be printed for the layer. In this regard, the illumination source 112 may be configured to include a first illumination profile for a lithography step of a first layer, a second illumination profile for a lithography step of a second layer, and the like.

Figure 3:
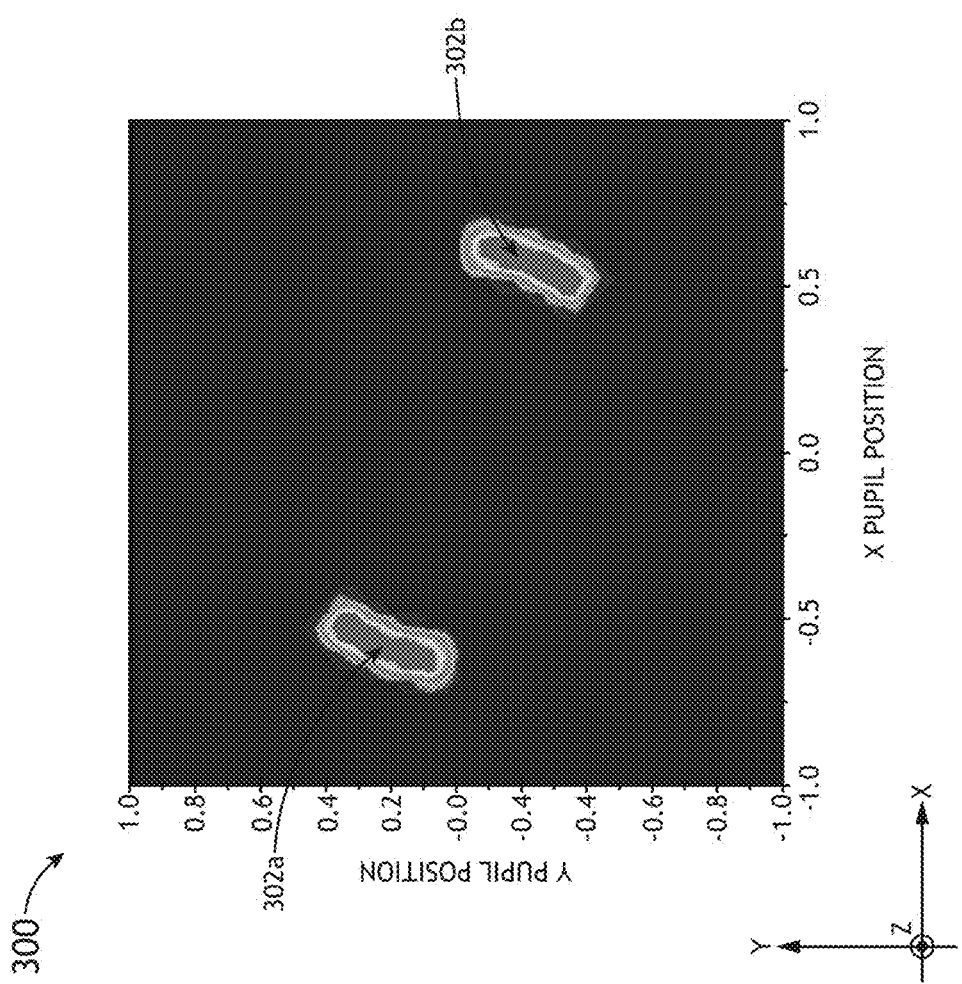
FIG. 3 is a plot illustrating a dipole illumination profile of an illumination source for the fabrication of rotated printed pattern elements, in accordance with one or more embodiments of the present disclosure.

FIG. 3 is a plot illustrating a dipole illumination profile 300 of an illumination source 112 for the fabrication of rotated printed pattern elements, in accordance with one or more embodiments of the present disclosure. A described above, a semiconductor device may be formed as multiple printed layers of patterned material.

In one embodiment, the dipole illumination profile 300 includes a first illumination pole 302a and a second illumination pole 302b distributed symmetrically around a central point of the dipole illumination profile 300 and separated along a direction rotated with respect to a measurement direction defined by a metrology target (e.g. a direction defined by one or more features of a metrology target printed as part of a previous process step or a direction defined by the design of a features to be printed in a subsequent process step).

The illumination poles of the dipole illumination profile 300 may have any shape known in the art. In one embodiment, as shown in FIG. 3, the illumination poles are formed as arcs. For example, inner and outer extents of the illumination poles may be formed as portions of a circle centered at the optical axis of the lithography sub-system 102. In another embodiment, the illumination poles are formed as circles.

Figure 4A:
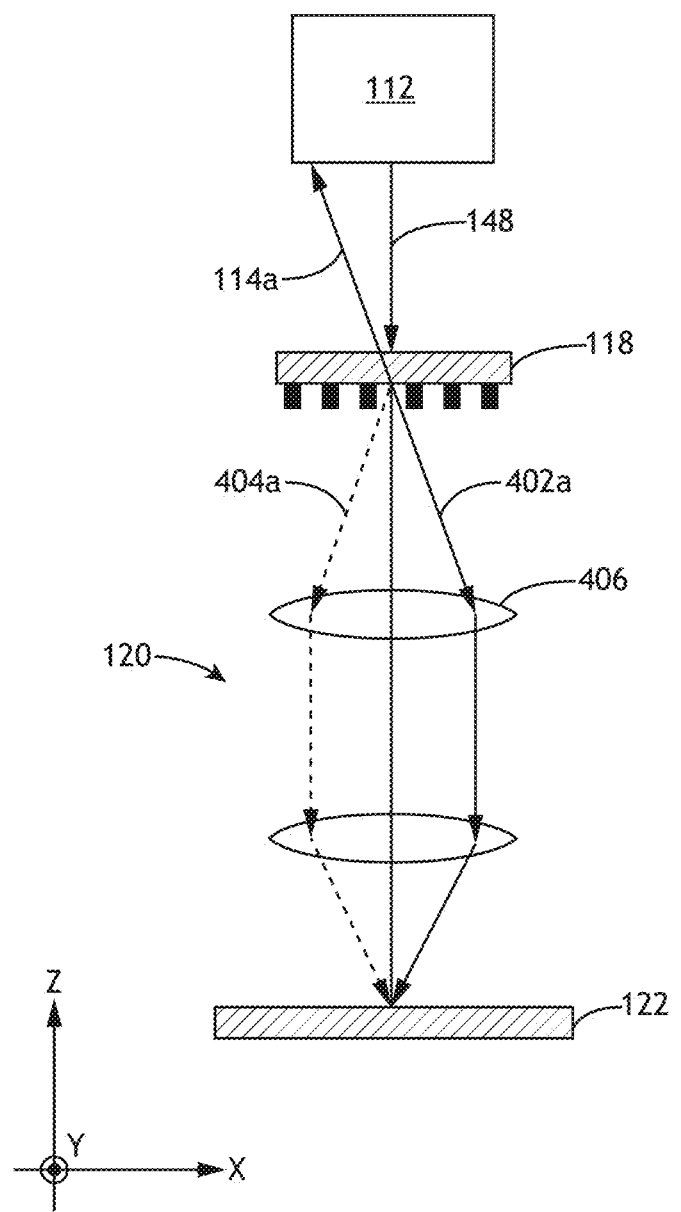
FIG. 4A is a conceptual view of lithography sub-system illustrating beam paths associated with multiple diffracted beams of the first illumination pole of the illumination source and a pattern mask, in accordance with one or more embodiments of the present disclosure.
Figure 4B:
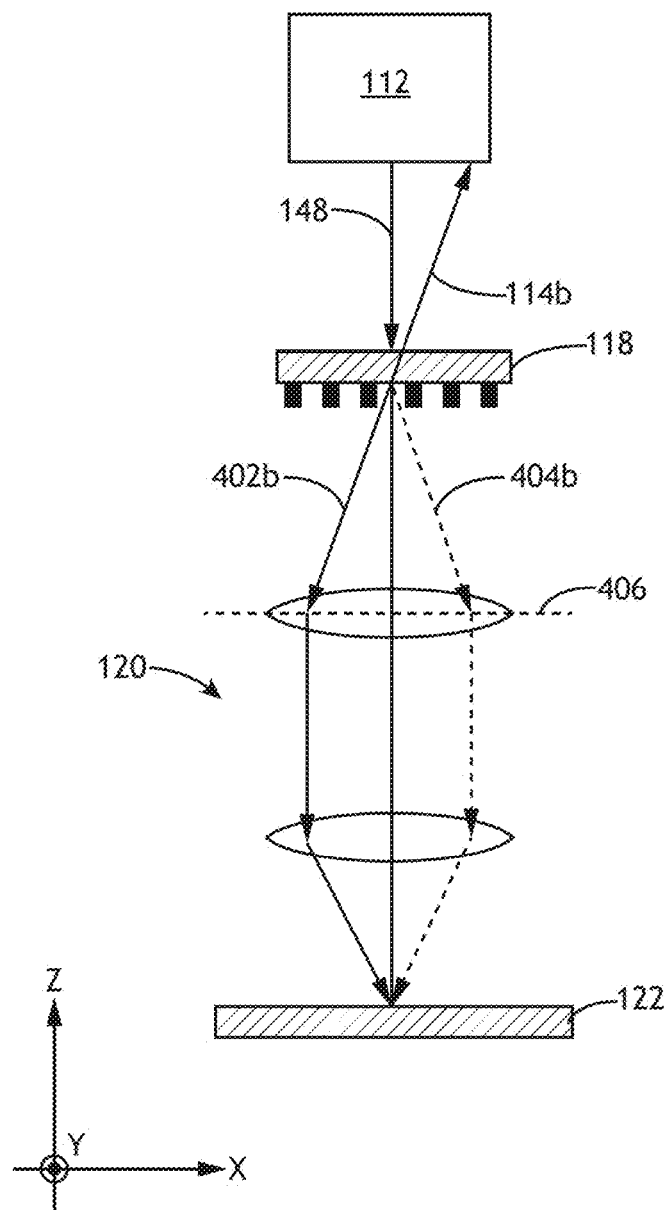
FIG. 4B is a conceptual view of lithography sub-system illustrating beam paths associated with multiple diffracted beams of the second illumination pole and a pattern mask, in accordance with one or more embodiments of the present disclosure.

FIGS. 4A and 4B are conceptual views illustrating a lithography sub-system 102 including an illumination source 112 configured as a dipole illumination source, in accordance with one or more embodiments of the present disclosure. FIG. 4A is a conceptual view of lithography sub-system 102 illustrating beam paths associated with multiple diffracted beams of the first illumination pole 302a of the illumination source 112 by a pattern mask 118, in accordance with one or more embodiments of the present disclosure. In one embodiment, the first illumination pole 302a generates an off-axis illumination beam 114a. In another embodiment, the pattern mask 118 diffracts the incident illumination beam 114a to generate multiple diffracted beams including, but not limited to, a 0-order diffracted beam 402a, and a $1^{st}$ order diffracted beam 404a. In another embodiment, two of the diffracted beams (e.g. 0-order diffracted beam 402a and $1^{st}$ order diffracted beam 404a) are captured by a set of projection optics 120 and directed to the sample 122 (e.g. a resist layer 126 of sample 122) to generate an aerial image of the pattern mask 118 on the sample 122. In this regard, the captured diffracted beams (e.g. the 0-order diffracted beam 402a and the $1^{st}$ order diffracted beam 404a as illustrated in FIG. 4A) lie within a pupil plane 406 of the lithography sub-system 102 (e.g. a pupil plane of the set of projection optics 120).

FIG. 4B is a conceptual view of lithography sub-system 102 illustrating beam paths associated with multiple diffracted beams of the second illumination pole 302b and a pattern mask 118, in accordance with one or more embodiments of the present disclosure. In one embodiment, the second illumination pole 302b generates an off-axis illumination beam 114b. In another embodiment, the pattern mask 118 diffracts the incident illumination beam 114b to generate multiple diffracted beams including, but not limited to, a 0-order diffracted beam 402b, and a $1^{st}$ order diffracted beam 404b. In another embodiment, two of the diffracted beams (e.g. 0-order diffracted beam 402b and $1^{st}$ order diffracted beam 404b) are captured by a set of projection optics 120 and directed to the sample 122 (e.g. a resist layer 126 of sample 122) to generate an aerial image of the pattern mask 118 on the sample 122. In this regard, the captured diffracted beams (e.g. the 0-order diffracted beam 402b and the $1^{st}$ order diffracted beam 404b as illustrated in FIG. 4B) lie within the pupil plane 406 of the lithography sub-system 102 (e.g. a pupil plane of the set of projection optics 120).

It is noted herein that beam paths associated with both FIGS. 4A and 4B, as well as additional pairs of symmetric illumination poles (not shown) may be simultaneously present to generate an aerial image of pattern mask 118 on the sample 122.

FIG. 5 is a plot 500 illustrating the distribution of diffracted beams 402a,402b,404a,404b in the pupil plane 406 of a lithography sub-system 102, in accordance with one or more embodiments of the present disclosure. In one embodiment, diffracted beams 402a,404a correspond to beam paths associated with diffraction of illumination beam 114a by pattern mask 118 as illustrated in FIG. 4A. For example, diffracted beam 402a may correspond to a 0-order diffracted beam and diffracted beam 404a may correspond to a $1^{st}$ order diffracted beam. Further, diffracted beams 402a,404a may be symmetrically distributed such that the optical phase difference between the diffracted beams 402a,404a is zero and the illumination of the sample is symmetric. Similarly, diffracted beams 402b,404b may correspond to beam paths associated with diffraction of illumination beam 114b by pattern mask 118 as illustrated in FIG. 4B. For example, diffracted beam 402b may correspond to a 0-order diffracted beam and diffracted beam 404b may correspond to a $1^{st}$ order diffracted beam.

In one embodiment, the illumination source 112 (e.g. the symmetric illumination source illustrated in FIGS. 4A and 4B, or the like) and the pattern mask 118 are co-optimized such that diffracted beams from each of a pair of symmetric illumination poles have the same optical path length when propagating through the lithography sub-system 102. For example, the illumination source 112 and the pattern mask 118 may be co-optimized such that diffracted beams are symmetrically distributed in a pupil plane 406. Further, diffracted beams 402b,404b may be symmetrically distributed such that the optical path difference between the diffracted beams 402b,404b is zero and the illumination of the sample is symmetric. Additionally, the beams from the two illumination poles may overlap. For example, as illustrated in FIG. 5, the diffracted beam 402a and diffracted beam 404b may overlap. Similarly, diffracted beam 402b and diffracted beam 404a may overlap.

In another embodiment, the separation of diffracted beams in the pupil plane 406 is designed to achieve a relatively high depth of field on the sample 122. For example, the separation of diffracted beams in the pupil plane 406 may be configured to be equal to the separation of the illumination poles of the illumination source 112. In this regard, the sensitivity of printed pattern elements to deviations of the focal position of the sample 122 may be reduced.

Figure 6:
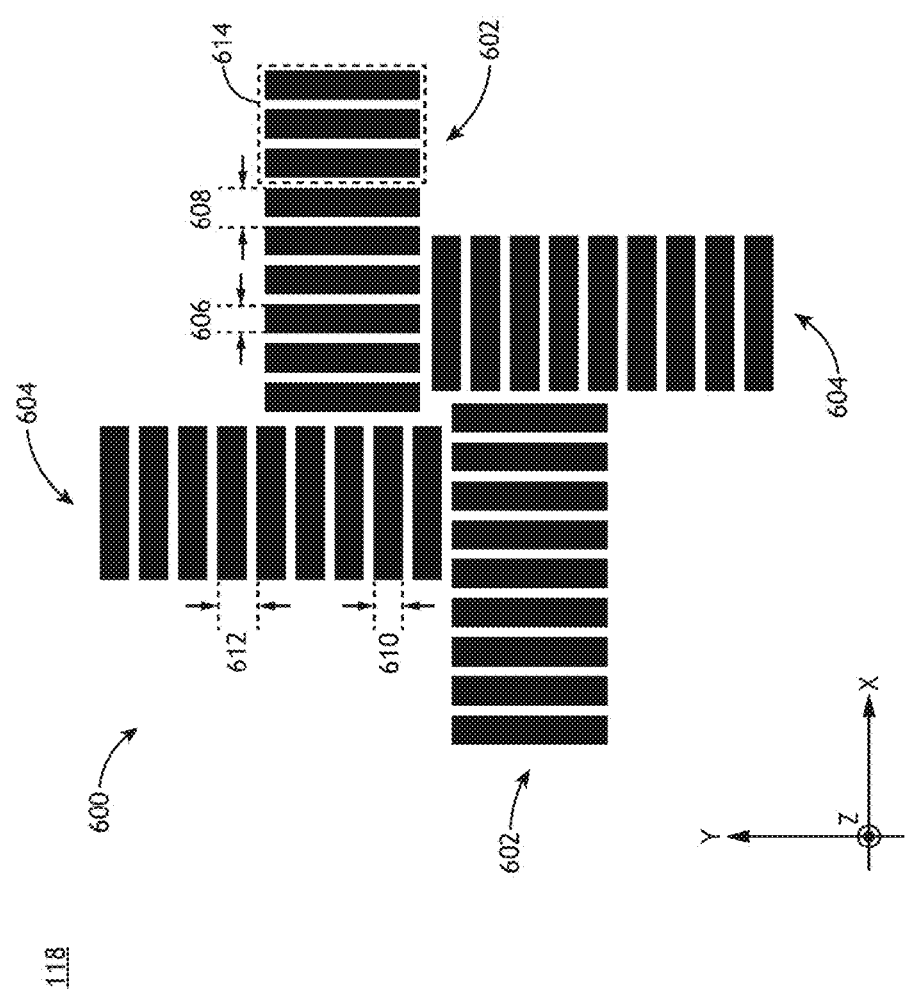
FIG. 6 is a top view of a portion of a pattern mask including a metrology target pattern mask, in accordance with one or more embodiments of the present disclosure.

FIG. 6 is a top view of a portion of a pattern mask 118 including a metrology target pattern mask 600, in accordance with one or more embodiments of the present disclosure. For example, the metrology target pattern mask 600 may be associated with one layer of an overlay metrology target as depicted in FIG. 2A. In one embodiment, the metrology target pattern mask 600 includes a first set of pattern mask features 602 oriented along a first direction (e.g. an X-direction) and a second set of pattern mask features 604 oriented along a second direction (e.g. a Y-direction). In another embodiment, the first set of pattern mask features 602 is segmented along the X-direction such that the relative position of the first set of pattern mask features 602 may provide an indication of any pattern placement error in the X-direction. For example, the first set of pattern mask features 602 may have a width 606 and pitch 608 along the X-direction. In another embodiment, the second set of pattern mask features 604 is segmented along the Y-direction such that the relative position of the second set of pattern mask features 604 may provide an indication of any pattern placement error in the Y-direction. For example, the second set of pattern mask features 604 may have a width 610 and pitch 612 along the Y-direction. Accordingly, the metrology target pattern mask 600 may have well-defined measurement directions along the X-direction and the Y-direction. In another embodiment, the width 606,610 of pattern mask features is at least half of the pitch 608,612. In this regard, the pattern mask features may be accurately printed on the sample 122. Further, a diffraction pattern associated with the pattern mask features may more accurately correspond to a diffraction pattern of device pattern mask elements.

In some embodiments, individual features of the metrology target pattern mask 600 of a printed layer of a semiconductor device are segmented to include pattern mask elements with dimensions and/or orientations corresponding to the pattern mask elements associated with the same layer. In this regard, printing characteristics of printed elements of the metrology target (e.g. metrology target 202, or the like) may correspond to the printing characteristics of the device elements in the same layer. Accordingly, the metrology target may provide diagnostic information related to the printing characteristics of the fabricated device elements. As an illustrative example, pattern mask elements with similar dimensions and/or orientation may similarly diffract an illumination beam 114 of the lithography sub-system 102 used to project an aerial image of the pattern mask 118 onto the sample 122. As another illustrative example, printed elements on the sample 122 with similar dimensions and/or orientation may similarly diffract a metrology illumination beam 130 of the metrology sub-system 104 used to diagnose the printing characteristics of a printed layer.

Figure 7A:
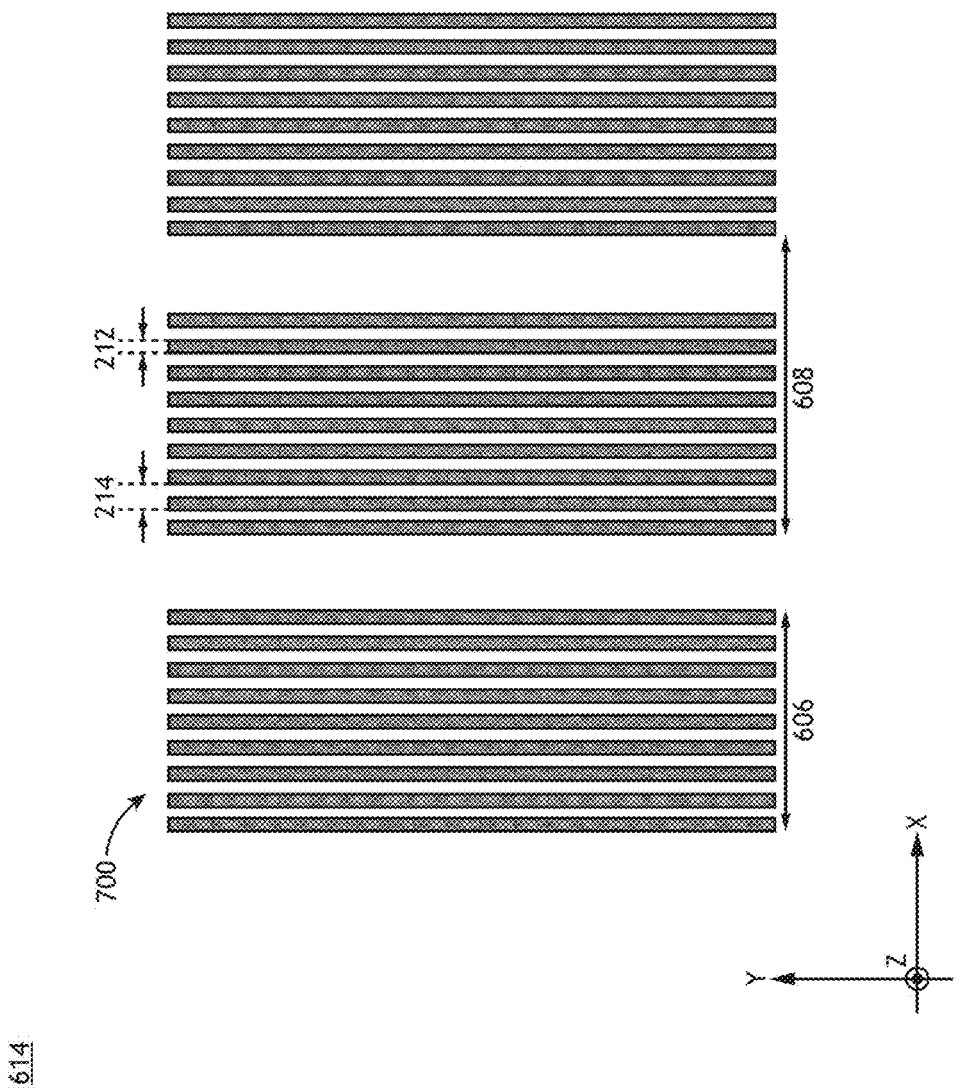
FIG. 7A is a top view of the portion of the metrology target pattern mask, in accordance with one or more embodiments of the present disclosure.
Figure 7B:
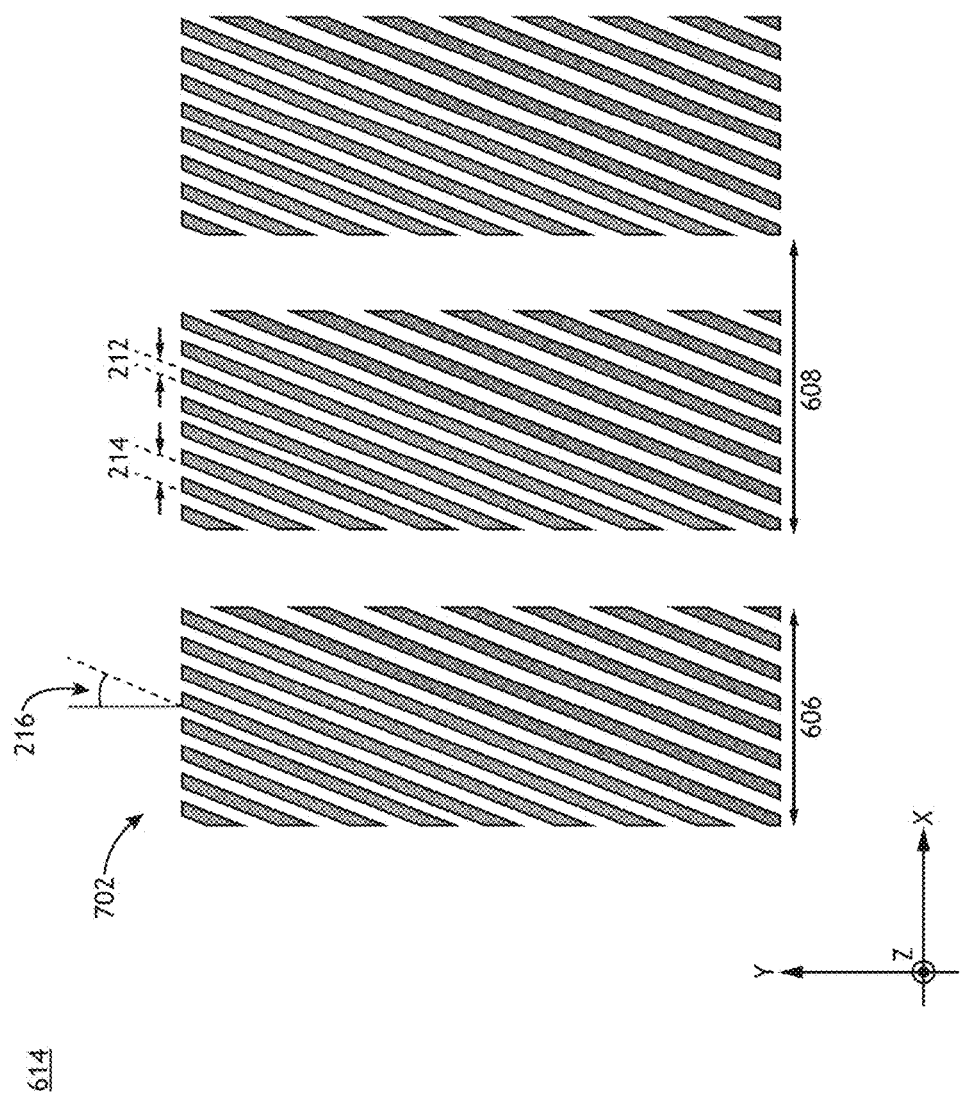
FIG. 7B is a top view of the portion of the metrology target pattern mask, in accordance with one or more embodiments of the present disclosure.
Figure 7C:
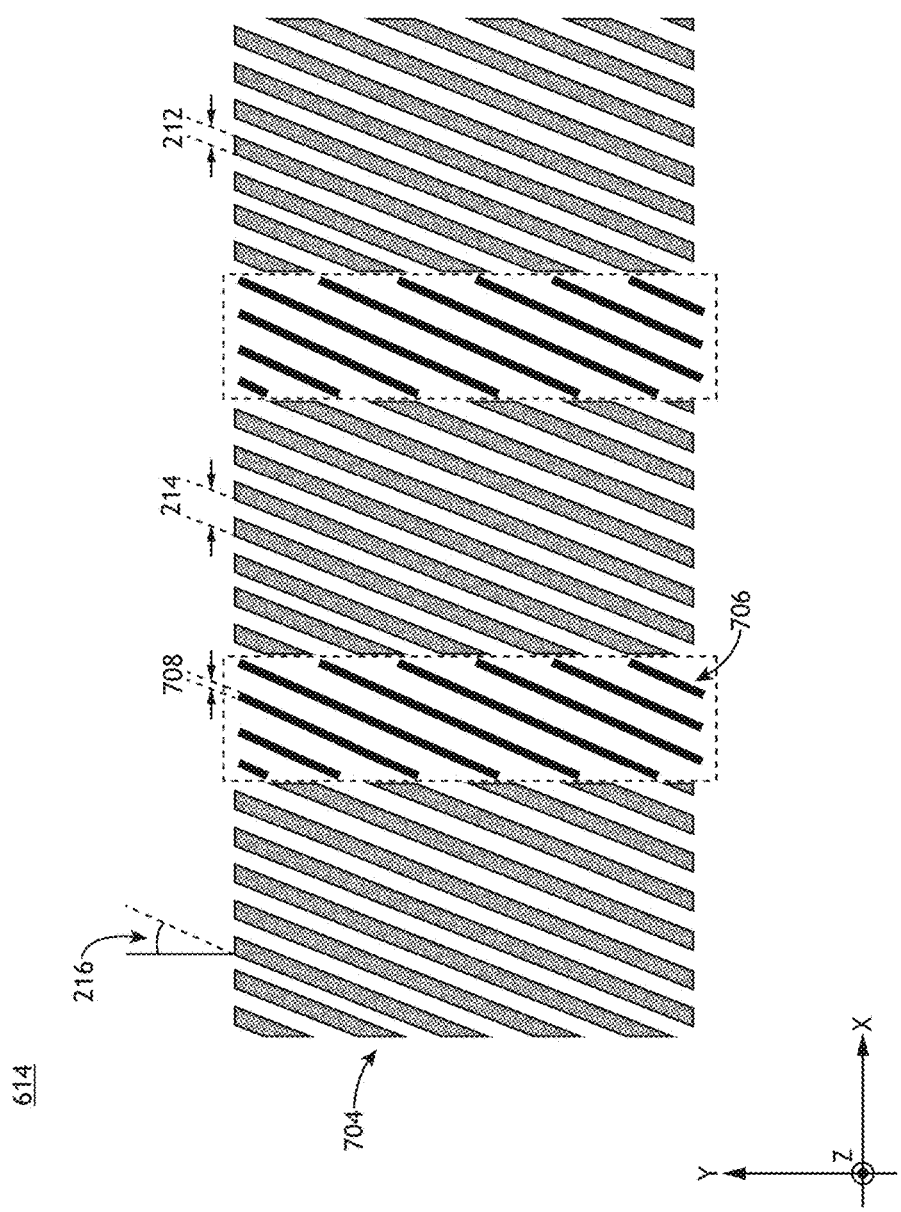
FIG. 7C is a top view of the portion of the metrology target pattern mask 60, in accordance with one or more embodiments of the present disclosure.

FIGS. 7A through 7C are top views of a portion 614 of the metrology target pattern mask 600 illustrating embodiments of the present disclosure in which individual features of the first set of pattern mask features 602 are segmented to include mask pattern elements with the same device width 212 and device pitch 214 as the printed device features 204 of the same printed layer (e.g. see FIG. 2).

FIG. 7A is a top view of the portion 614 of the metrology target pattern mask 600, in accordance with one or more embodiments of the present disclosure. In one embodiment, pattern mask features 700 are segmented along the X-direction. In this regard, the individual pattern mask elements of the pattern mask features 700 may have the same dimensions as the printed device features 204, but a different orientation).

FIG. 7B is a top view of the portion 614 of the metrology target pattern mask 600, in accordance with one or more embodiments of the present disclosure. In one embodiment, pattern mask features 702 of the first set of pattern mask features 602 are oriented with the same rotation angle 216 as the printed device features 204. Accordingly, the individual pattern mask elements of the pattern mask features 702 may have the same dimensions and orientation as the printed device features 204.

It is noted herein that the image of a pattern mask 118 generated on a sample (e.g. by lithography sub-system 102) may critically depend on the proximity of pattern mask elements within a pattern mask. In this regard, pattern mask elements with dimensions (e.g. actual dimensions, separations between pattern mask elements, or the like) smaller than a resolution of the lithography sub-system 102 (e.g. the set of projection optics 120) may influence a pattern printed on a resist layer of a sample based on optical effects such as scattering, diffraction, and the like. Further, sub-resolution pattern mask elements (alternatively, sub-resolution assist features (SRAFs), optical proximity correction (OPC) pattern mask elements, or the like) may influence one or more characteristics of printed elements (e.g. PPE, sidewall angle, critical dimension, or the like) without being resolvably imaged onto the sample 122. For example, sub-resolution pattern mask elements may facilitate the fabrication of robust printed elements on the sample 122 without being resolvably printed.

FIG. 7C is a top view of the portion 614 of the metrology target pattern mask 600, in accordance with one or more embodiments of the present disclosure. In one embodiment, pattern mask features 704 of the first set of pattern mask features 602 are oriented with the same rotation angle 216 as the printed device features 204. Accordingly, the individual pattern mask elements of the pattern mask features 704 may have the same dimensions and orientation as the printed device features 204.

In another embodiment, the metrology target pattern mask 600 includes sub-resolution pattern mask elements 706. In another embodiment, the sub-resolution pattern mask elements 706 include pattern mask features with separated with the same device pitch 214 and rotation angle 216 as the printed device features 204, but have a width 708 along the pitch direction smaller than a resolution of the lithography sub-system 102. In this regard, the sub-resolution pattern mask elements 706 may not be resolvably printed on the sample 122, but may affect the printing characteristics of the metrology target pattern mask 600 to correspond to the printing characteristics of the printed device features 204. For example, the sub-resolution pattern mask elements 706 may counteract diffraction associated with additional edges of the metrology target pattern mask 600 not present in the device pattern mask elements (e.g. via OPC, or the like).

In another embodiment, as shown in FIG. 7C, the sub-resolution pattern mask elements 706 may include extensions of the first set of pattern mask features 602. In this regard, the metrology target pattern mask 600 may include pattern mask elements with varying width such that some portions of the pattern mask elements may be printed on the sample 122, while other portions may not be printed.

In another embodiment, the sub-resolution pattern mask elements 706 may not include extensions of the first set of pattern mask features 602. Accordingly, the metrology target pattern mask 600 may include second set of pattern mask features 604 with any dimensions and/or orientations suitable for facilitating the fabrication of a metrology target on a printed layer of a sample 122 with printing characteristics corresponding to the printing characteristics of printed device elements of the layer.

The sub-resolution pattern mask elements 706 may be located between the first set of pattern mask features 602 (e.g. as shown in FIG. 7C) and/or surrounding the first set of pattern mask features 602. Additionally, although sub-resolution pattern mask elements 706 are illustrated in a select portion 614 of the metrology target pattern mask 600, the sub-resolution pattern mask elements 706 may be included in any portion of the metrology target pattern mask 600 such as, but not limited to, adjacent to the second set of pattern mask features 604. Accordingly, FIGS. 7A through 7C along with the descriptions of the metrology target pattern mask 600, the first set of pattern mask features 602, the second set of pattern mask features 604, and the sub-resolution pattern mask elements 706 above are provided for solely for illustrative purposes and should not be interpreted as limiting.

In some embodiments, pattern mask features of a metrology target pattern mask are designed to have a diffraction pattern corresponding to the diffraction pattern of pattern mask features associated with device features of the same printed layer. As described above, it is generally desirable that a metrology target exhibit the same printing characteristics (e.g. pattern placement error, sidewall angle, or the like) as device features of the same printed layer. It is noted herein that a lithography step of a semiconductor process may include forming an aerial image of the pattern mask 118 on the sample 122 (e.g. to expose a resist layer 126, or the like). Further, the distribution of illumination in the pupil plane of the lithography sub-system 102 (e.g. pupil plane 406 of FIG. 4, or the like) includes the diffracted orders of illumination collected by the set of projection optics 120 used to form the aerial image. Accordingly, the printing characteristics of a printed element may depend at least in part on the pupil-plane diffraction profile. In this regard, designing pattern mask features of a metrology target pattern mask to exhibit a diffraction pattern corresponding to the device pattern element diffraction pattern may provide similar printing characteristics for the metrology target and the printed device elements.

Figure 8A:
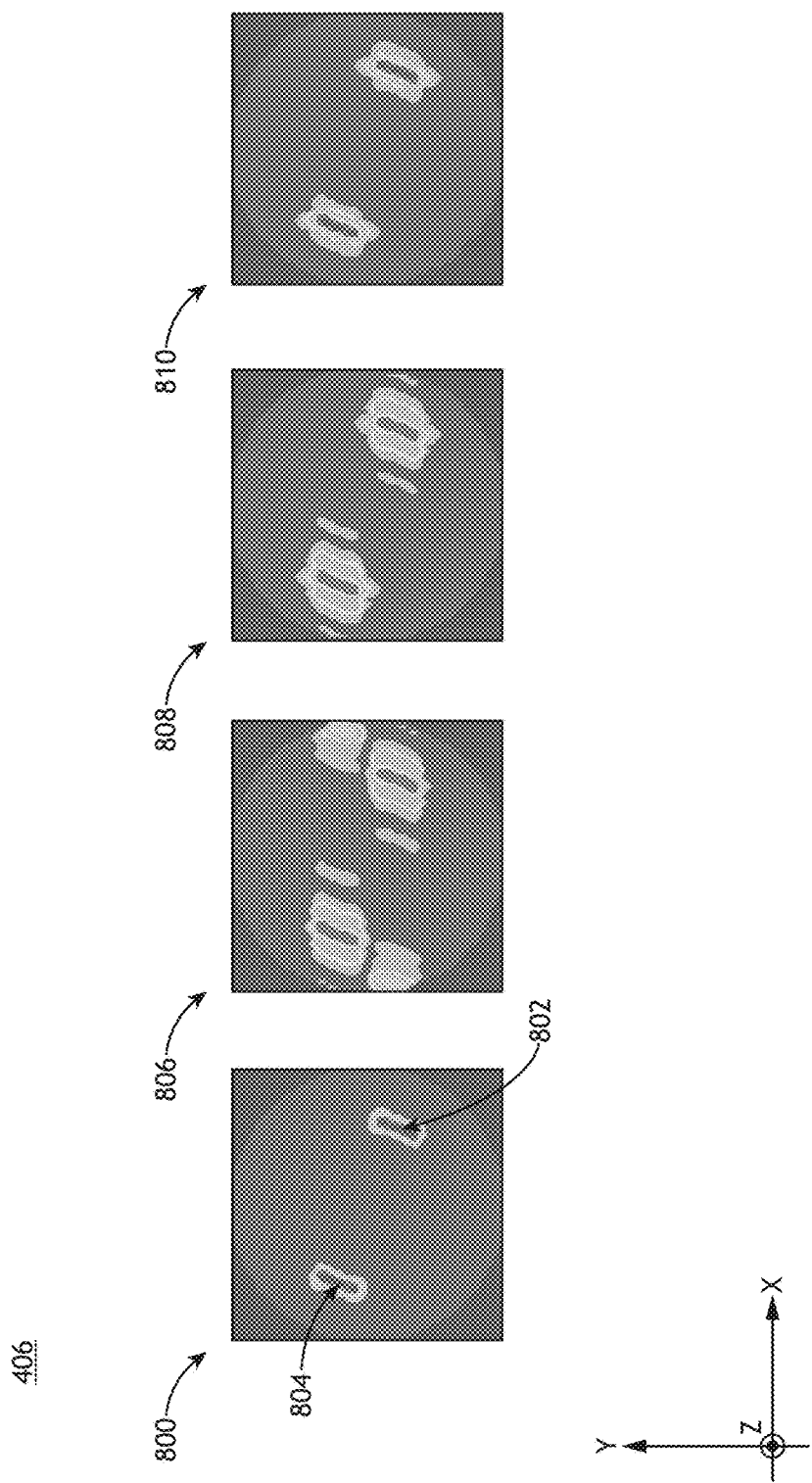
FIG. 8A includes diffraction profiles illustrating pupil plane diffraction patterns of binary pattern masks including rotated line/space pattern mask elements associated with a device and metrology pattern mask features illustrated in FIGS. 7A through 7C, in accordance with one or more embodiments of the present disclosure.
Figure 8B:
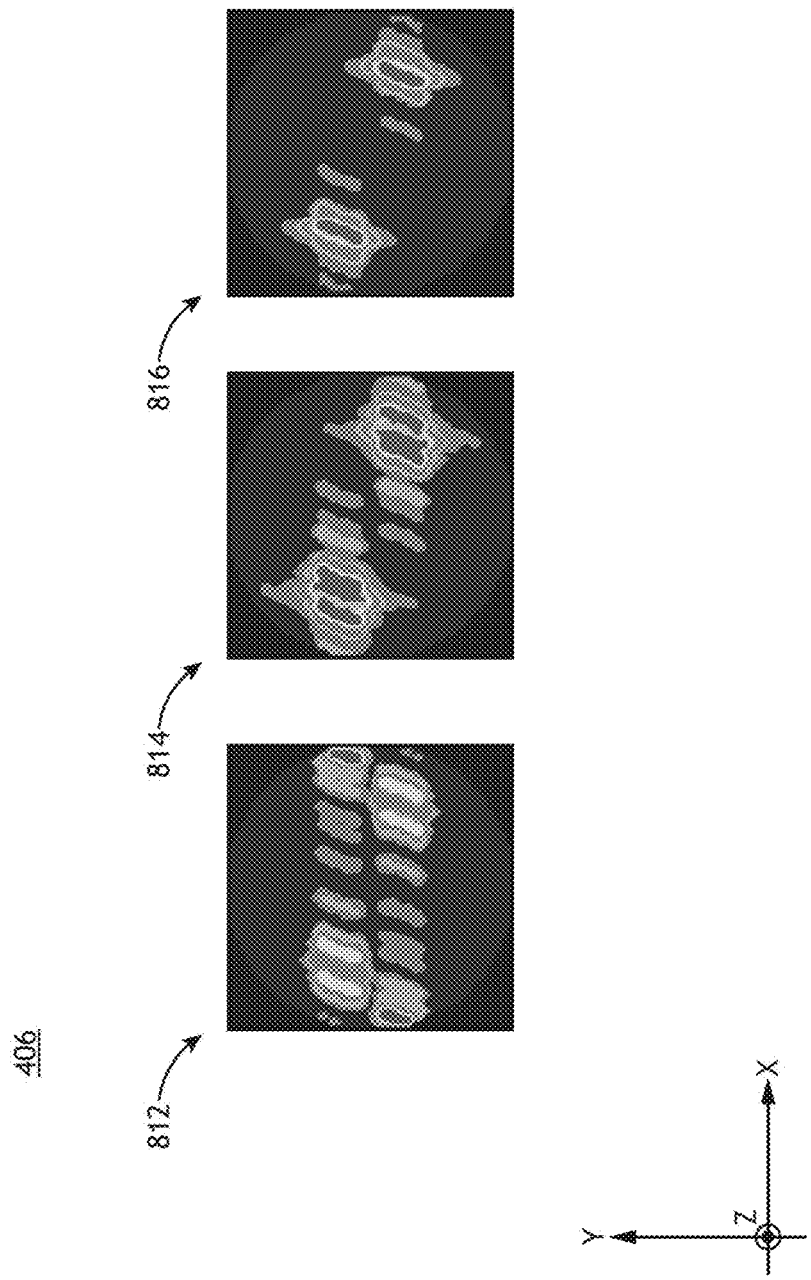
FIG. 8B includes diffraction profiles illustrating pupil plane diffraction patterns of phase-shift pattern masks including rotated line/space pattern mask elements associated with a device and metrology pattern mask features illustrated in FIGS. 7A through 7C, in accordance with one or more embodiments of the present disclosure.

FIGS. 8A and 8B includes diffraction profiles illustrating pupil plane diffraction patterns of pattern masks including rotated line/space pattern mask elements associated with a device and metrology pattern mask features 700-706 illustrated in FIGS. 7A through 7C, for binary and phase-shift pattern masks, respectively. In one embodiment, diffraction profiles are generated with an illumination source 112 configured with the rotated dipole illumination profile of FIG. 3 having a rotation angle 216 corresponding to the rotation angle 216 of the printed device features 204 illustrated in FIG. 2B.

FIG. 8A includes diffraction profiles illustrating pupil plane diffraction patterns of binary pattern masks including rotated line/space pattern mask elements associated with a device as well as metrology pattern mask features 700-706 illustrated in FIGS. 7A through 7C, in accordance with one or more embodiments of the present disclosure. In another embodiment, diffraction profile 800 illustrates a diffraction profile of a binary pattern mask 118 including line/space pattern mask elements for the formation of the printed device features 204 of FIG. 2. For example, illumination lobe 802 of diffraction profile 800 may include overlapping illumination from 0-order diffraction of illumination beam 114a and 1-order diffraction of illumination beam 114b (e.g. see FIGS. 4A, 4B and 5). Further, illumination lobe 804 of diffraction profile 800 may include overlapping illumination from 0-order diffraction of illumination beam 114b and 1-order diffraction of illumination beam 114a (e.g. see FIGS. 4A and 4B).

In another embodiment, diffraction profile 806 illustrates a diffraction profile of a binary pattern mask 118 including metrology pattern mask features 700 illustrated in FIG. 7A. In another embodiment, diffraction profile 808 illustrates a diffraction profile of a binary pattern mask 118 including metrology pattern mask features 702 illustrated in FIG. 7B. In another embodiment, diffraction profile 810 illustrates a diffraction profile of a binary pattern mask 118 including metrology pattern mask features 704 illustrated in FIG. 7C. In this regard, pattern mask elements of the metrology target pattern mask 600 of a printed layer of a semiconductor device segmented to have dimensions and/or orientations corresponding to the device pattern mask elements associated with the same layer may exhibit similar diffraction patterns as the device pattern mask elements. Accordingly, printing characteristics of printed elements of the metrology target (e.g. metrology target 202, or the like) may correspond to the printing characteristics of the device elements in the same layer.

As illustrated in FIG. 8A, it may be the case that matching both the dimensions and the orientation of pattern elements of a segmented metrology target pattern mask feature to those of device pattern mask elements may provide a more accurate representation of the diffraction profile of the device pattern mask elements than matching either the dimensions or the orientation alone. For example, diffraction profile 808 of pattern mask features 702 of FIG. 7B may more accurately correspond to the diffraction profile 800 of the device pattern mask elements than diffraction profile 806 of pattern mask features 700. Further, it may be the case that diffraction profiles of metrology target pattern mask elements including sub-resolution features may further correspond to diffraction profiles of the device pattern mask elements. In one instance, sub-resolution features may counteract artifacts associated with edges of metrology target pattern mask features not present for the device pattern mask elements. For example, diffraction profile 810 of pattern mask features 704 including sub-resolution pattern mask elements 706 may more accurately correspond to the diffraction profile 800 than either of diffraction profile 808 or diffraction profile 806.

FIG. 8B includes diffraction profiles illustrating pupil plane diffraction patterns of phase-shift pattern masks including rotated line/space pattern mask elements associated with a device and metrology pattern mask features 700-706 illustrated in FIGS. 7A through 7C, in accordance with one or more embodiments of the present disclosure. In another embodiment, diffraction profile 812 illustrates a diffraction profile of a phase-shift pattern mask 118 including metrology pattern mask features 700 illustrated in FIG. 7A. In another embodiment, diffraction profile 814 illustrates a diffraction profile of a phase-shift pattern mask 118 including metrology pattern mask features 702 illustrated in FIG. 7B. In another embodiment, diffraction profile 816 illustrates a diffraction profile of a phase-shift pattern mask 118 including metrology pattern mask features 704 illustrated in FIG. 7C.

Similarly, metrology target pattern mask elements of phase-shift pattern mask 118 segmented to have dimensions and/or orientations corresponding to the device pattern mask elements associated with the same layer may exhibit similar diffraction patterns as the device pattern mask elements (e.g. diffraction profile 800). Accordingly, printing characteristics of printed elements of the metrology target (e.g. metrology target 202, or the like) may correspond to the printing characteristics of the device elements in the same layer.

FIG. 9A is a diagram view of a printed pattern feature 900 associated with pattern mask features 700 illustrated in FIG. 7A and generated using the rotated dipole illumination profile 300 of FIG. 3, in accordance with one or more embodiments of the present disclosure. In one embodiment, a mismatch between an orientation angle of illumination poles of an illumination source 112 and the orientation of pattern mask elements of the pattern mask features 700 results in printing errors of printed pattern feature 900. For example, a cross-sectional profile 902 of printed pattern feature 900 illustrates varying printed characteristics such as, but not limited to, variations of the critical dimensions, sidewall angles, or the printed depth of pattern elements of the printed pattern feature 900.

FIG. 9B is a diagram view of a printed pattern feature 904 associated with pattern mask features 702 illustrated in FIG. 7B and generated using the rotated dipole illumination profile 300 of FIG. 3, in accordance with one or more embodiments of the present disclosure. Matching an orientation angle of illumination poles of an illumination source 112 to the orientation of the pattern mask features 702 may reduce printing errors of printed pattern feature 904. For example, a cross-sectional profile 906 of printed pattern feature 904 may illustrate steeper sidewall angles and a more consistent printed depth of pattern elements of the printed pattern feature 904 than illustrated in FIG. 8A.

FIG. 9C is a diagram view of a printed pattern feature 908 associated with pattern mask features 704 illustrated in FIG. 7C and generated using the rotated dipole illumination profile 300 of FIG. 3, in accordance with one or more embodiments of the present disclosure. Matching an orientation angle of illumination poles of an illumination source 112 to the orientation of the pattern mask features 704 may reduce printing errors of printed pattern feature 908 (e.g. relative to printing characteristics illustrated in FIG. 8A or 8B). Further, sub-resolution pattern mask elements 706 of the metrology target pattern mask 600 may facilitate more robust printing characteristics of the printed pattern feature 908. For example, a cross-sectional profile 910 of printed pattern feature 908 may illustrate more uniform critical dimension of pattern elements near the edges of printed pattern feature 908 (e.g. within portion 912, or the like) than illustrated in FIG. 8A or 8B.

Referring again to FIGS. 1A through 1D, an illumination source (e.g. the illumination source 112, the metrology illumination source 128, or the like) may include any illumination source known in the art suitable for generating an illumination beam (e.g. illumination beam 114, metrology illumination beam 130, or the like). For example, the illumination source may include, but is not limited to, a monochromatic light source (e.g. a laser), a polychromatic light source with a spectrum including two or more discrete wavelengths, a broadband light source, or a wavelength-sweeping light source. Further, the illumination source may be, but is not required to be, formed from a white light source (e.g. a broadband light source with a spectrum including visible wavelengths), a laser source, a free-form illumination source, a single-pole illumination source, a multi-pole illumination source, an arc lamp, an electrodeless lamp, or a laser sustained plasma (LSP) source.

In another embodiment, the wavelengths of radiation of the one or more illumination beams emitted by the illumination source are tunable. In this regard, the wavelengths of radiation of the one or more illumination beams may be adjusted to any selected wavelength of radiation (e.g. UV radiation, visible radiation, infrared radiation, or the like).

The illumination source may also be configured to provide light having high brightness. For example, the illumination source may provide an illumination beam having a brightness greater than about 1 W/(nm cm$^2$ Sr). The system 100 may also include a fast feedback to the light source for stabilizing its power and wavelength. Output of the light source can be delivered via free-space propagation, or in some cases delivered via optical fiber or light guide of any type. Further, an illumination beam may be delivered via free-space propagation or guided light (e.g. an optical fiber, a light pipe, or the like).

It is further noted herein that, for the purposes of the present disclosure, an illumination pole of the illumination source (e.g. illumination source 112 of lithography sub-system 102) may represent illumination from a specific location of the illumination source. In this regard, each spatial location on an illumination source with respect to an optical axis 148 may be considered an illumination pole. Further, an illumination pole may have any shape or size known in the art. Additionally, a free-form illumination source may be considered to have an illumination profile corresponding to a distribution of illumination poles.

It is noted herein that the pattern mask 118 may be a reflective or a transmissive element. In one embodiment, the pattern mask 118 is a transmissive element in which pattern elements fully or partially block the transmission of an illumination beam 114 (e.g. through absorption or reflection of the illumination beam 114). Accordingly, the illumination beam 114 may be transmitted through spaces between pattern elements to the set of projection optics 120. For example, a pattern mask 118 in which pattern elements fully block the transmission of the illumination beam 114 may operate as a binary pattern mask. It is further recognized that focus-sensitive binary pattern masks in which light from an illumination source 112 is either fully blocked or fully transmitted/reflected to generate an image may be utilized to determine a focal position of a sample in a lithography sub-system 102. For example, binary pattern masks are relatively inexpensive to fabricate and may be readily incorporated into many lithography systems. In another embodiment, features of the pattern mask 118 (e.g. pattern elements, spaces between pattern elements, or the like) are designed to modify the optical phase of an illumination beam 114. In this regard, the pattern mask 118 may operate as a phase mask (e.g. an alternating phase shift mask, or the like).

In another embodiment, the pattern mask 118 is a reflective mask in which pattern mask elements fully or partially reflect an illumination beam 114 to the set of projection optics 120 and the spaces between pattern mask elements absorb or transmit the illumination beam 114. Further, pattern elements of the pattern mask 118 may be formed from any opaque or semi-opaque material known in the art for reflecting and/or absorbing an illumination beam 114. In another embodiment, the pattern mask elements may include a metal. For example, the pattern mask elements may be, but are not required to be, formed from chrome (e.g. a chrome alloy, or the like).

In this regard, the mask support device 116 may hold the pattern mask 118 utilizing any means known in the art, such as, but not limited to, a mechanical, vacuum, electrostatic or other clamping technique.

In another embodiment, the system 100 includes a sample stage 124 suitable for securing a sample 122. The sample stage 124 may include any sample stage architecture known in the art. For example, the sample stage 124 may include, but is not limited to, a linear stage. By way of another example, the stage assembly 118 may include, but is not limited to, a rotational stage. Further, the sample 106 may include a wafer, such as, but not limited to, a semiconductor wafer.

Figure 1D:
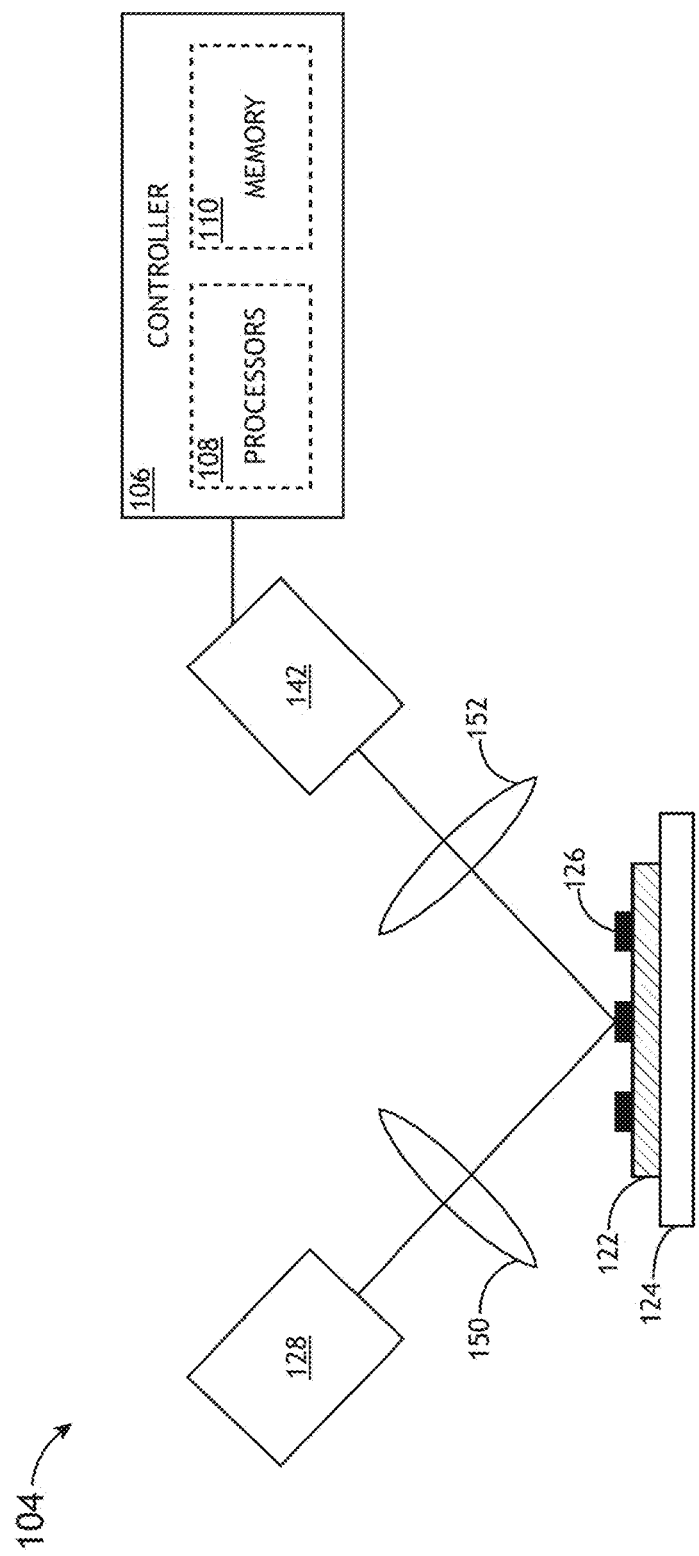
FIG. 1D is a conceptual view illustrating a metrology sub-system, in accordance with another embodiment of the present disclosure.

Referring to FIGS. 1C and 1D, embodiments of the present disclosure may incorporate any type of metrology system known in the art including, but not limited to, a spectroscopic ellipsometer with one or more angles of illumination, a spectroscopic ellipsometer for measuring Mueller matrix elements (e.g. using rotating compensators), a single-wavelength ellipsometer, an angle-resolved ellipsometer (e.g. a beam-profile ellipsometer), a spectroscopic reflectometer, a single-wavelength reflectometer, an angle-resolved reflectometer (e.g. a beam-profile reflectometer), an imaging system, a pupil imaging system, a spectral imaging system, or a scatterometer. Further, the metrology system may include a single metrology tool or multiple metrology tools. A metrology system incorporating multiple metrology tools is generally described in U.S. Pat. No. 7,478,019. Focused beam ellipsometry based on primarily reflective optics is generally described in U.S. Pat. No. 5,608,526, which is incorporated herein by reference in its entirety. The use of apodizers to mitigate the effects of optical diffraction causing the spread of the illumination spot beyond the size defined by geometric optics is generally described in U.S. Pat. No. 5,859,424, which is incorporated herein by reference in its entirety. The use of high-numerical-aperture tools with simultaneous multiple angle-of-incidence illumination is generally described by U.S. Pat. No. 6,429,943, which is incorporated herein by reference in its entirety.

It is further recognized herein that a metrology tool may measure characteristics of one or more targets such as, but not limited to, critical dimensions (CD), overlay, sidewall angles, film thicknesses, or process-related parameters (e.g. focus, dose, and the like). The targets may include certain regions of interest that are periodic in nature, such as for example gratings in a memory die. The metrology targets may further possess various spatial characteristics and are typically constructed of one or more cells which may include features in one or more layers which may have been printed in one or more lithographically distinct exposures. The targets or the cells may possess various symmetries such as two-fold or four-fold rotation symmetry, reflection symmetry. Examples of such metrology structures are described in U.S. Pat. No. 6,985,618, which is included herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures. The periodic structures may be non-segmented or they may be constructed from finely segmented features which may at or close to the minimum design rule of the lithographic process used to print them.

Metrology targets may be collocated or in close proximity with dummification structures in the same layer or in a layer above, below or in between the layers of the metrology structures. Targets can include multiple layers (e.g. films) whose thicknesses can be measured by the metrology tool. Further, a metrology tool may, but is not required to, measure the composition of one or more layers of a semiconductor stack or one or more defects on or within a sample. The use of a metrology tool to characterize non-periodic targets is generally described in U.S. Pat. No. 9,291,554, granted on Mar. 22, 2016, which is incorporated herein by reference in its entirety.

Targets can include target designs placed on the semiconductor wafer for use (e.g., with alignment, overlay registration operations, and the like). Further, targets may be located at multiple sites on the semiconductor wafer. For example, targets may be located within scribe lines (e.g., between dies) and/or located in the die itself. Multiple targets may be measured simultaneously or serially by the same or multiple metrology tools as described in U.S. Pat. No. 7,478,019, which is incorporated herein by reference in its entirety.

Additionally, measurement of parameters of interest may involve a number of algorithms. For example, optical interaction of the metrology illumination beam 130 with a metrology target on the sample 106 may, but is not limited to, be modeled using an electro-magnetic (EM) solver. Further, the EM solver may utilize any method known in the art including, but not limited to, rigorous coupled-wave analysis (RCWA), finite element method analysis, method of moments analysis, a surface integral technique, a volume integral technique, or a finite-difference time-domain analysis. Additionally, collected data may be analyzed using data fitting and optimization techniques including, but not limited to libraries, fast-reduced-order models, regression, machine-learning algorithms such as neural networks, support-vector machines (SVM), dimensionality-reduction algorithms (e.g. principal component analysis (PCA), independent component analysis (ICA), local-linear embedding (LLE), and the like), sparse representation of data (e.g. Fourier or wavelet transforms, Kalman filters, algorithms to promote matching from same or different tool types, and the like). For example, data collection and/or fitting may be, but is not required to be, performed by the Signal Response Metrology (SRM) software product provided by KLA-TENCOR.

In another embodiment, raw data generated by a metrology tool is analyzed by algorithms that do not include modeling, optimization and/or fitting (e.g. phase characterization, or the like). The use of symmetric target design in scatterometry overlay metrology is generally described in U.S. Patent Publication No. 2015/0204664, published on Jul. 23, 2015, which is incorporated herein by reference in its entirety. It is noted herein that computational algorithms performed by the controller may be, but are not required to be, tailored for metrology applications through the use of parallelization, distributed computation, load-balancing, multi-service support, design and implementation of computational hardware, or dynamic load optimization. Further, various implementations of algorithms may be, but are not required to be, performed by the controller (e.g. though firmware, software, or field-programmable gate arrays (FPGAs), and the like), or one or more programmable optical elements associated with the metrology tool. The use of process modeling is generally described in U.S. Patent Publication No. 2014/0172394, published on Jun. 19, 2014, which is incorporated herein by reference in its entirety.

In another embodiment, the angle of incidence of the metrology illumination beam 130 on the sample 122 is adjustable. For example, the path of the metrology illumination beam 130 through the beamsplitter 138 and the objective lens 140 may be adjusted to control the angle of incidence of the metrology illumination beam 130 on the sample 122. In this regard, the metrology illumination beam 130 may have a nominal path through the beamsplitter 126 and the objective lens 140 such that the metrology illumination beam 130 has a normal incidence angle on the sample 122. Further, the angle of incidence of the metrology illumination beam 130 on the sample 122 may be controlled by modifying the position and/or angle of the metrology illumination beam 130 on the beamsplitter 138 (e.g. by rotatable mirrors, a spatial light modulator, a free-form illumination source, or the like). In another embodiment, the metrology illumination source 128 directs the one or more metrology illumination beam 130 to the sample 122 at an angle (e.g. a glancing angle, a 45-degree angle, or the like).

In another embodiment, the controller 106 is communicatively coupled to the metrology illumination source 128 to direct the adjustment of the angle of incidence between the metrology illumination beam 130 and the sample 122. In another embodiment, the controller 106 directs the metrology illumination source 128 to provide one or more selected wavelengths of illumination (e.g. in response to feedback). In a general sense, the controller 106 may be communicatively coupled with any element within the metrology sub-system 104.

FIG. 1D is a conceptual view illustrating a metrology sub-system 104, in accordance with another embodiment of the present disclosure. In one embodiment, the illumination pathway 132 and the collection pathway 144 contain separate elements. For example, the illumination pathway 132 may utilize a first focusing element 150 to focus the metrology illumination beam 130 onto the sample 122 and the collection pathway 144 may utilize a second focusing element 152 to collect radiation from the sample 122. In this regard, the numerical apertures of the first focusing element 150 and the second focusing element 152 may be different. Further, it is noted herein that the metrology sub-system 104 depicted in FIG. 1D may facilitate multi-angle illumination of the sample 122, and/or more than one metrology illumination source 128 (e.g. coupled to one or more additional detectors 142). In this regard, the metrology sub-system 104 depicted in FIG. 1D may perform multiple metrology measurements. In another embodiment, one or more optical components may be mounted to a rotatable arm (not shown) pivoting around the sample 122 such that the angle of incidence of the metrology illumination beam 130 on the sample 122 may be controlled by the position of the rotatable arm.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100. Further, the controller 106 may analyze data received from the detector 142 and feed the data to additional components within the metrology sub-system 104 or external to the system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random access memory, a magnetic or optical memory device (e.g., disk), a magnetic tape, a solid state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

Figure 10:
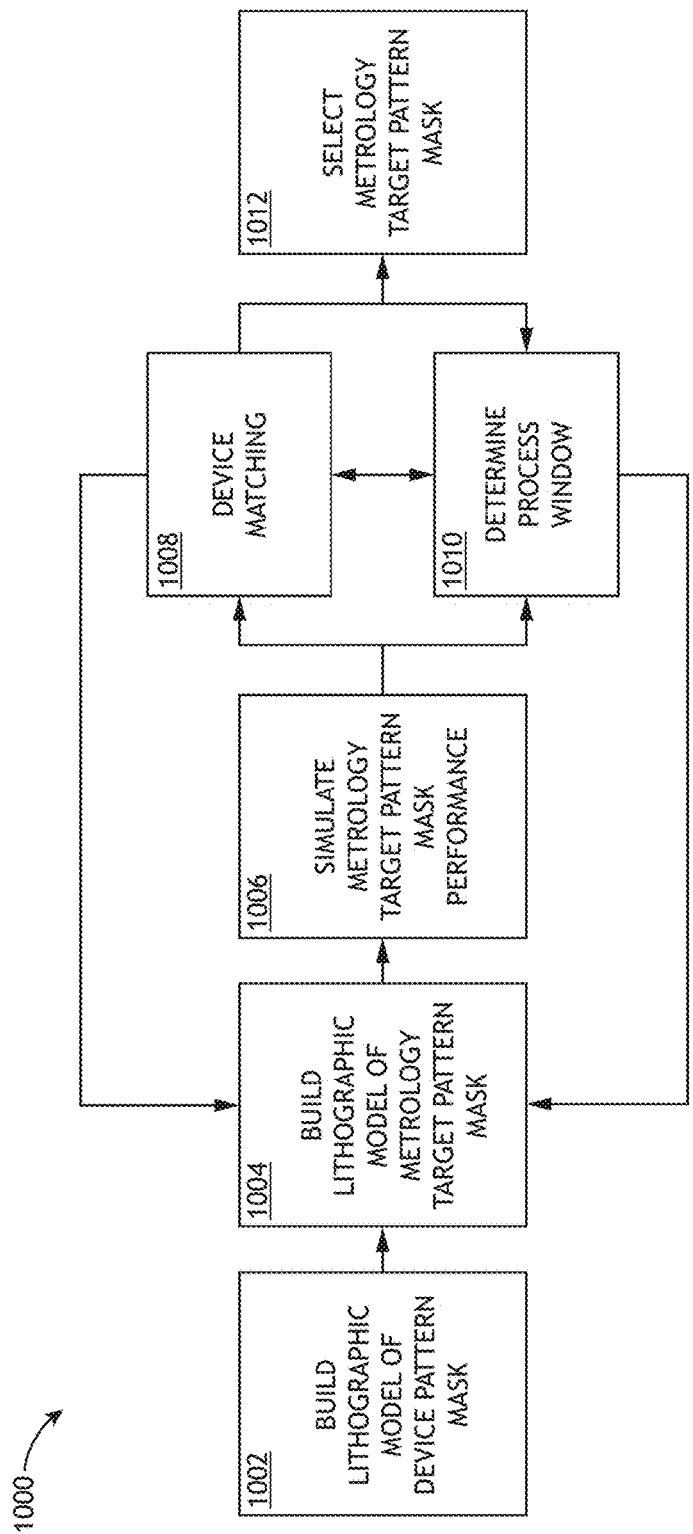
FIG. 10 is a flow diagram illustrating a method for co-optimizing metrology pattern mask elements and device pattern mask elements to facilitate the printing of metrology targets and devices with similar printing characteristics, in accordance with one or more embodiments of the present disclosure.

FIG. 10 is a flow diagram illustrating a method 1000 for co-optimizing metrology pattern mask elements and device pattern mask elements to facilitate the printing of metrology targets and devices with similar printing characteristics, in accordance with one or more embodiments of the present disclosure. Applicant notes that the embodiments and enabling technologies described previously herein in the context of system 100 should be interpreted to extend to method 1000. It is further noted, however, that the method 1000 is not limited to the architecture of system 100.

In one embodiment, a step 1002 includes building lithographic and/or a geographic model of a device. For example, step 1002 may include building a lithographic model of at least a portion of a device to be fabricated as part of a printed layer of a semiconductor device. In another embodiment, a step 1004 includes building a lithography model of one or more metrology targets. In this regard a parameterized version of the device and/or one or more metrology targets are generated. Additionally, the use of a geometric engine for process modeling may be implemented in the ACUSHAPE software product provided by KLA-TENCOR.

In another embodiment, a step 1006 includes simulating metrology target performance. For example, one or more aspects of a metrology measurement such as, but not limited to contrast, precision, or diffraction efficiency may be simulated for the one or more metrology targets. In this regard, the performance of one or more metrology targets may be simulated, evaluated, and/or compared.

In another embodiment, a step 1008 includes matching one or more printing characteristics (e.g. one or more simulated printing characteristics) of the one or more metrology target pattern masks to the printing characteristics of the device pattern mask. In this regard, any differences between the printed characteristics of the metrology target pattern masks and printed device elements may be evaluated. As described above, it is generally desirable that a metrology target and device elements be printed with the same printing characteristics such that the printing characteristics of the metrology target measured by the metrology sub-system 104 may be representative of the device elements. For example, step 1008 may include, but is not required to include, a simulation of the pattern placement error of one or more printed elements of each of the metrology targets for comparison to the pattern placement error of the one or more printed device elements.

A simulation of printing characteristics of may be performed by any method known in the art. For example, a Zernike sensitivity analysis may be, but is not required to be, utilized to simulate a pattern placement error.

In another embodiment, step 1008 includes simulating the printing performance of metrology target pattern masks for a multitude of segmentation pitches (e.g. separation distances between individual pattern mask elements of a metrology target pattern mask. In this regard, a segmentation distance for each metrology target pattern mask may be determined that most accurately provides printed characteristics corresponding to the printing characteristics of the printed device elements. It is noted herein that an optimal segmentation pitch may, but is not required to, match the pitch of the device pattern elements.

In another embodiment, a step 1010 includes determining a process window associated with each metrology target pattern mask. It is recognized herein that, in the context of lithographic printing, the process window associated with the fabrication of printed features on a sample typically defines ranges of process parameters suitable for fabrication of the printed features within a specified tolerance. For example, a process window may define limits on the defocus associated with the position of the sample along the optical axis of the lithography tool (e.g. the focal position of the sample). By way of another example, a process window may define limits on the dose of energy from the illumination source incident on the sample (e.g. the exposure of the sample). Further, the impacts of variations of multiple process parameters on one or more characteristics of the printed features may be interdependent. In this regard, determining a process window may include a multi-dimensional analysis of multiple process parameters (e.g. a focus-exposure matrix (FEM), or the like) to define acceptable ranges of process parameters of interest. It is further recognized that a metrology target pattern mask having a relatively large process window may be relatively robust to deviations of the lithography sub-system 102.

In another embodiment, a step 1012 includes selecting a metrology target pattern mask. For example, a metrology target pattern mask may be selected based on a combination of factors including metrology performance (e.g. as determined by step 1006), the degree to which printing characteristics match those of device pattern mask elements (e.g. as determined by step 1008), a size of a process window (e.g. as determined by step 1010), or the like. In some embodiments, a metrology target pattern mask may be selected based on an iterative application of steps of the method 1000. For example, after step 1008 of device matching and/or step 1010 of determining a process window for one or more metrology target pattern masks, a new model of a new metrology target pattern mask may be generated in step 1004 and analyzed in steps 1006-1010.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A lithography system, comprising:
an illumination source including two illumination poles symmetrically distributed around an optical axis of the lithography system, wherein the two illumination poles are separated along a first direction;
a pattern mask positioned to receive illumination from the illumination source, wherein the pattern mask includes a metrology target pattern mask and a plurality of device pattern mask elements, wherein at least a portion of the device pattern mask elements are distributed along the first direction and diffract illumination from the two illumination poles with a first diffraction distribution, wherein the metrology target pattern mask includes a set of metrology target pattern mask elements distributed along the first direction, wherein the set of metrology target pattern mask elements diffract illumination from the two illumination poles with a second diffraction distribution, wherein the second diffraction distribution corresponds to the first diffraction distribution within a selected accuracy; and
a set of projection optics to image the pattern mask onto a sample with illumination from the two illumination poles diffracted illumination by the pattern mask, wherein one or more printing characteristics of a metrology target generated on the sample associated with an image of the metrology target pattern mask are measurable along a second direction different than the first direction.

2. The lithography system of claim 1, wherein the one or more printing characteristics comprise:
at least one of pattern placement on the sample, overlay, a critical dimension, or a sidewall angle.

3. The lithography system of claim 1, wherein the metrology target pattern mask is segmented along the second direction, wherein the metrology target pattern mask includes one or more sub-resolution regions between at least two adjacent segments.

4. The lithography system of claim 3, wherein the sub-resolution regions include one or more features smaller than an optical resolution of the set of projection optics such that the metrology target on the sample imaged on the sample by the set of projection optics does not include the portions of the metrology target pattern mask elements within the sub-resolution regions.

5. The lithography system of claim 3, wherein widths of portions of the metrology target pattern mask elements within the sub-resolution regions measured along the first direction are smaller than an optical resolution of the set of projection optics, wherein the metrology target imaged on the sample by the set of projection optics does not include the portions of the metrology target pattern mask segments within the sub-resolution regions.

6. The lithography system of claim 1, wherein the metrology target pattern mask is segmented to include one or more features distributed along the second direction.

7. The lithography system of claim 6, wherein segments of the metrology target pattern mask element are separated along the second direction by a target separation distance.

8. The lithography system of claim 7, wherein the target separation distance is smaller than a length of the segments of the metrology target pattern element along the second direction.

9. The lithography system of claim 1, wherein the pattern mask is at least one of a bright-field pattern mask or a dark-field pattern mask.

10. A lithography system, comprising:
   an illumination source including two illumination poles symmetrically distributed around an optical axis of the lithography system, wherein the two illumination poles are separated along a first direction;
   a pattern mask positioned to receive illumination from the illumination source, wherein the pattern mask includes a metrology target pattern mask and a plurality of device pattern mask elements, wherein at least a portion of the device pattern mask elements are distributed along the first direction with a device separation distance, wherein the metrology target pattern mask includes a set of metrology target pattern mask elements distributed along the first direction with the device separation distance; and
   a set of projection optics to image the pattern mask onto a sample, wherein one or more printing characteristics of a metrology target generated on the sample associated with an image of the metrology target pattern mask is measurable along a second direction different than the first direction.

11. The lithography system of claim 10, wherein a diffraction pattern of the metrology target pattern mask corresponds to a diffraction pattern of the portion of the device pattern mask elements distributed along the first direction with the device separation distance within a selected accuracy.

12. The lithography system of claim 10, wherein the metrology target pattern mask is segmented along the second direction, wherein the metrology target pattern mask includes one or more sub-resolution regions between at least two adjacent segments.

13. The lithography system of claim 12, wherein the sub-resolution regions include one or more features smaller than an optical resolution of the set of projection optics such that the metrology target imaged on the sample by the set of projection optics does not include the portions of the metrology target pattern mask elements associated with the sub-resolution regions.

14. The lithography system of claim 12, wherein widths of portions of the metrology target pattern mask elements within the sub-resolution regions measured along the first direction are smaller than an optical resolution of the set of projection optics, wherein the metrology target imaged on the sample by the set of projection optics does not include the portions of the metrology target pattern mask segments within the sub-resolution regions.

15. The lithography system of claim 10, wherein the metrology target pattern mask is segmented to include one or more features distributed along the second direction.

16. The lithography system of claim 15, wherein segments of the metrology target pattern mask element are separated along the second direction by a target separation distance.

17. The lithography system of claim 16, wherein the target separation distance is smaller than a length of the segments of the metrology target pattern element along the second direction.

18. The lithography system of claim 10, wherein the pattern mask is at least one of a bright-field pattern mask or a dark-field pattern mask.

19. The lithography system of claim 1, wherein an angle between the first direction and the second direction is less than 90 degrees.

20. The lithography system of claim 1, wherein the set of metrology target pattern mask elements are configured to diffract illumination from the two illumination poles with the second diffraction distribution being the same as the first diffraction distribution.

21. The lithography system of claim 10, wherein an angle between the first direction and the second direction is less than 90 degrees.

22. The lithography system of claim 10, wherein the set of metrology target pattern mask elements are configured to diffract illumination from the two illumination poles with the second diffraction distribution being the same as the first diffraction distribution.

23. The lithography system of claim 10, wherein the one or more printing characteristics comprise:
   at least one of pattern placement on the sample, overlay, a critical dimension, or a sidewall angle.

* * * * *